(12) United States Patent
Osweiler

(10) Patent No.: US 10,368,641 B2
(45) Date of Patent: Aug. 6, 2019

(54) ELECTRICALLY INTEGRATED SALON STYLING CHAIR WITH ERGONOMIC EQUIPMENT CADDY

(71) Applicant: Cathryn A Osweiler, Phoenix, AZ (US)

(72) Inventor: Cathryn A Osweiler, Phoenix, AZ (US)

(*) Notice: Subject to any disclaimer, the term of this patent is extended or adjusted under 35 U.S.C. 154(b) by 0 days.

(21) Appl. No.: 16/155,809

(22) Filed: Oct. 9, 2018

(65) Prior Publication Data
US 2019/0038026 A1 Feb. 7, 2019

Related U.S. Application Data

(63) Continuation of application No. 15/813,100, filed on Nov. 14, 2017, now Pat. No. 10,117,515, which is a continuation-in-part of application No. 15/367,292, filed on Dec. 2, 2016, now Pat. No. 9,814,315, which is a continuation-in-part of application No. 14/172,047, filed on Feb. 4, 2014, now Pat. No. 9,516,950.

(60) Provisional application No. 61/760,635, filed on Feb. 4, 2013.

(51) Int. Cl.
| | | |
|---|---|---|
| A47C 1/11 | (2006.01) | |
| H05K 5/02 | (2006.01) | |
| A47C 7/62 | (2006.01) | |

(52) U.S. Cl.
CPC .................. *A47C 1/11* (2013.01); *A47C 7/62* (2013.01); *H05K 5/0213* (2013.01); *H05K 5/0217* (2013.01); *H05K 5/0247* (2013.01)

(58) Field of Classification Search
None
See application file for complete search history.

(56) References Cited

U.S. PATENT DOCUMENTS

| | | | | | |
|---|---|---|---|---|---|
| 4,807,929 | A | * | 2/1989 | Balsbaugh | A47C 3/04 297/188.04 |
| 5,713,628 | A | * | 2/1998 | Lucatuorto | A47C 7/62 297/188.05 |
| 5,813,354 | A | * | 9/1998 | Scott | B60N 3/004 108/44 |
| 6,032,808 | A | * | 3/2000 | Henson | A47G 7/044 211/85.23 |

(Continued)

*Primary Examiner* — David E Allred
(74) *Attorney, Agent, or Firm* — Paul B. Heynssens

(57) ABSTRACT

A salon chair with rail system and an integral electrical supply. A salon chair that includes an integrated tool work station (with multi-use containers, utility tray and articulating arm) with the capacity to hold a hair dryer, curling irons, clippers and the like at the rear of the chair. The chair is powered by an integrated electrical power source inside the rear of the chair seat whereby the power is supplied through to the base of the chair. The power source may be connected to an outlet under the chair or concealed under a power extension with cord cover (preventing trips and falls), or may be otherwise coupled to utility power. A caddy adapter kit. The caddy adapter kit including a frame in which a user configurable array of containers may be disposed. The frame being attachably mounted to the back of a styling or salon chair by a band encircling the chair back, or optionally with the frame being fixabaly attached to the chair back by screws or the like.

15 Claims, 26 Drawing Sheets

(56) References Cited

U.S. PATENT DOCUMENTS

| | | | | |
|---|---|---|---|---|
| 7,063,187 B1* | 6/2006 | Lavigne | ............... | E06C 1/39 |
| | | | | 182/129 |
| 8,636,319 B1* | 1/2014 | Parker, Jr. | ............... | A47C 7/62 |
| | | | | 248/311.2 |
| 2005/0145769 A1* | 7/2005 | Ives | ............... | G09F 15/0087 |
| | | | | 248/447.1 |
| 2005/0247653 A1* | 11/2005 | Brooks | ............... | A47F 5/0846 |
| | | | | 211/94.01 |
| 2009/0184077 A1* | 7/2009 | Curet | ............... | A45D 44/04 |
| | | | | 211/117 |
| 2010/0012344 A1* | 1/2010 | Dannenberg | ............... | A45D 20/12 |
| | | | | 174/53 |
| 2011/0248531 A1* | 10/2011 | Powell | ............... | A47C 1/11 |
| | | | | 297/163 |
| 2014/0252820 A1* | 9/2014 | Botello | ............... | F16M 13/02 |
| | | | | 297/188.04 |
| 2014/0374556 A1* | 12/2014 | Zobel | ............... | A47F 5/0006 |
| | | | | 248/224.8 |
| 2017/0105586 A1* | 4/2017 | Hurley | ............... | A47F 5/0876 |
| 2017/0164772 A1* | 6/2017 | Laderer-Alber | ............... | A47G 29/08 |

* cited by examiner

1809
Top view of hair dye container with integrated wipe bar.

1803
'J-hook' attachment used to hold
water spray bottles or clippers.

ELECTRICALLY INTEGRATED SALON STYLING CHAIR WITH ERGONOMIC EQUIPMENT CADDY

CROSS-REFERENCE TO RELATED APPLICATIONS

This application is a continuation application of Ser. No. 15/813,100 filed Nov. 14, 2017 which is a continuation in part of Ser. No. 15/367,292 filed Dec. 2, 2016 issued as U.S. Pat. No. 9,814,215 Nov. 14, 2017 and is a continuation in part application of Ser. No. 14/172,047 issued as U.S. Pat. No. 9,516,950 Dec. 13, 2016 which claims the benefit of provisional application Ser. 62/261,905 filed Dec. 2, 2015 and provisional application Ser. No. 61/760,635 filed Feb. 4, 2013; Ser. No. 15/367,292 U.S. Pat. No. 9,814,315 claims the benefit of provisional application Ser. 62/525,739 filed Jun. 28, 2017, the contents of which are hereby incorporated by reference.

TECHNICAL FIELD

This description relates generally to salon styling chairs and more specifically to salon styling chairs coupled to electrical utilities.

BACKGROUND

Stylist chairs are used by barbers and hair stylist. Such chairs typically rotate on a center pedestal, and may be raised and lowered so that a stylist or barber may be provided with an advantageous work position without having to bend or stretch.

SUMMARY

The following presents a simplified summary of the disclosure in order to provide a basic understanding to the reader. This summary is not an extensive overview of the disclosure and it does not identify key/critical elements of the invention or delineate the scope of the invention. Its sole purpose is to present some concepts disclosed herein in a simplified form as a prelude to the more detailed description that is presented later.

The present example provides a salon chair that includes an integrated tool work station with the capacity to hold a hair dryer, curling irons, clippers and the like at the rear of the chair. The chair has a unique rail system on its back that allows the mounting of receptacles for styling tools and chemicals, as well as the mounting of a stylists tray directly on the chair back, or coupled to the chair back by an articulating arm. The rail system allows for a high degree of customization to meet each stylists needs, while presenting a tidy and streamlined appearance in the work area. Power connections are also provided to allow connection of stylists tools through the chair/caddy system, without having to plug such tools into a wall outlet, and having them out of reach on a counter.

The chair is powered by an integrated electrical power source connection: inside the rear of the chair through to the base of the chair to a floor or equivalent electrical outlet; the exterior 10 amp (or alternative amperage) power strip with exterior 'On/Off' switch may be attached to a power receptacle at the base of the chair and may be coupled to an accordion extension cord (or equivalent); and the power source may be connected to an outlet under the chair or concealed under a power extension with cord cover (preventing trips and falls), or may be otherwise coupled to utility power.

The chair is powered by an integrated electrical power connection attachment to the aluminum support frame of the tool caddy. Styling tools are connected via a pigtail extension cord to an outlet under the chair or concealed under a power extension with cord cover (preventing trips and falls), or may be otherwise coupled to utility power.

Also described is a retrofit caddy adaptor kit for use with a conventional stylist's chair. The retrofit caddy may include a frame that is secured to a chair back by a band. The frame accepts a number of styling product containers and provides storage hooks for hanging various usefull items. The adaptor kit may be a stand-alone design or product.

Many of the attendant features will be more readily appreciated as the same becomes better understood by reference to the following detailed description considered in connection with the accompanying drawings.

DESCRIPTION OF THE DRAWINGS

The present description will be better understood from the following detailed description read in light of the accompanying drawings, wherein.

Like reference numerals are used to designate like parts in the accompanying drawings.

DETAILED DESCRIPTION

Figure 1:
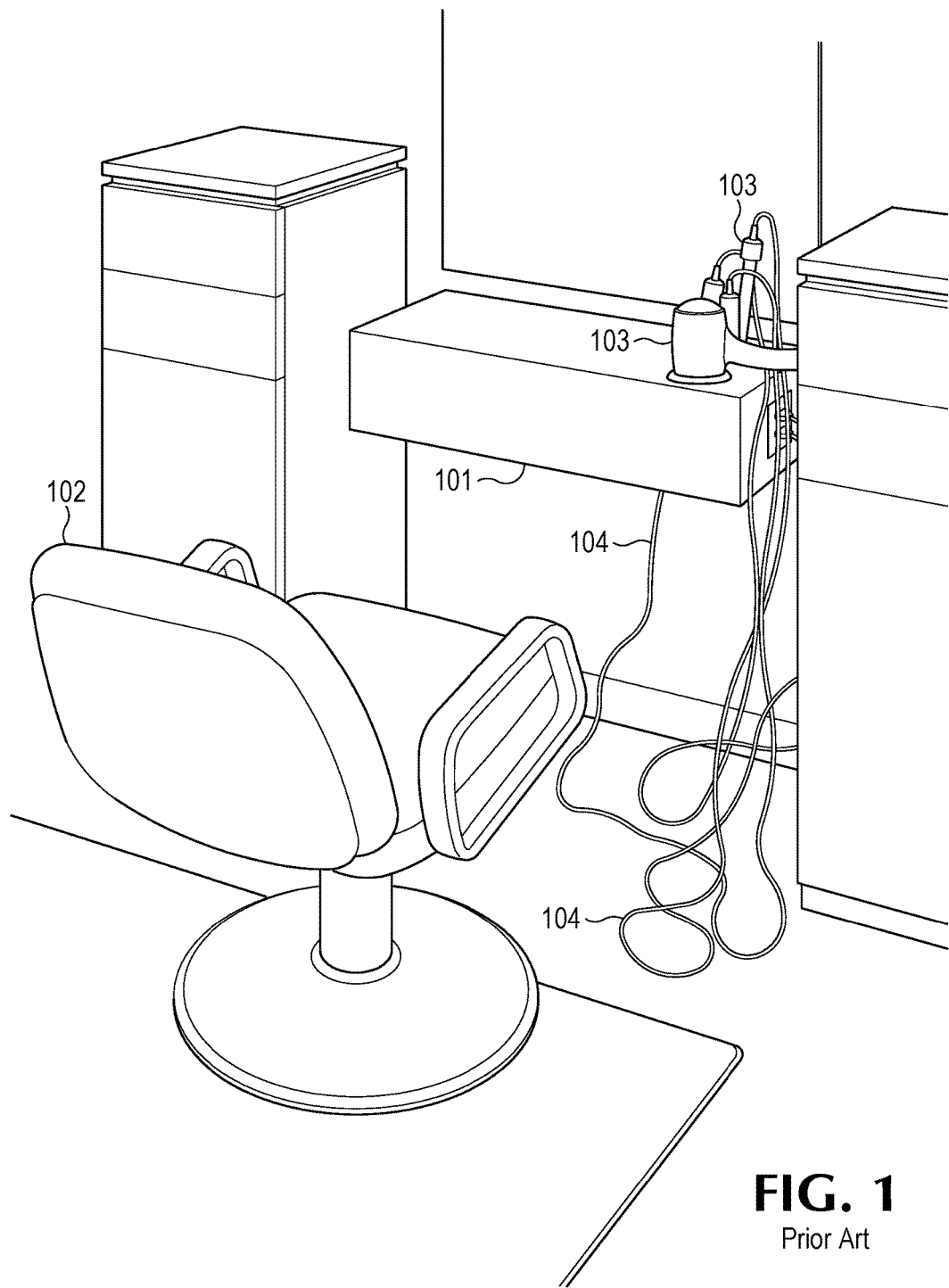
FIG. 1 shows a typical styling station with chair, styling equipment and dangling cords.

The detailed description provided below in connection with the appended drawings is intended as a description of the present examples and is not intended to represent the only forms in which the present example may be constructed or utilized. The description sets forth the functions of the example and the sequence of steps for constructing and operating the example. However, the same or equivalent functions and sequences may be accomplished by different examples.

The examples below describe a styling chair as typically used by hair stylists or barbers. Although the present examples are described and illustrated herein as being implemented in a hair styling system, the system described is provided as an example and not a limitation. As those skilled in the art will appreciate, the present examples are suitable for application in a variety of different types of seating systems where corded instruments may be used in conjunction with providing services to a seated person.

Salon/barber styling chairs are common place for both men and women presenting in a variety of styles and designs. The need for electrically safe and ergonomically correct workstations is highly desirable. Three issues with salon and barber chairs can be: dangling electrical cords connected to styling equipment at the workstation, ineffective power integration to the styling chair as well as styling equipment not ergonomically accessible or not adaptable to the left handed stylist. Therefore, an electrically integrated salon/barber styling chair with ergonomic equipment access is described in this application.

The examples illustrated may include the dimensions provided herein. The following dimensions are but one example. Other equivalent configurations are possible. The styling seat and chair back may be connected to a ½-¾ inch solid steel tubular frame, or equivalent, and corresponding support structure. Exemplary chair dimensions are as follows:

Seat=19" wide×19" deep, or equivalent
Seat back=17" wide×16" high, or equivalent
Floor to seat height 20", or equivalent
Seat travel range 20"-26" high, or equivalent
Inside dimensions (arm to arm) 19", or equivalent
Outside dimensions (arm to arm) 25", or equivalent
Base dimensions 28"×28", or equivalent The Chair functions in unison with the set of two heavy gauge aluminum rails removably attached to the rear of the chair back measuring approximately 14" long by 1" wide.

The rail system is constructed to hold/accommodate four utility containers in addition to styling accessory options (utility containers, removable work tray or removable articulating arm) may be used as customized by the stylist. All accessories are attached to the 'rail system' via an 'L-shaped' bracket.

Utility Container Design (dimensions are exemplary and not limiting):
Height=5"
Width=3"
Depth=4½"-5"
Construction lightweight aluminum.
Interchangeable high temperature aluminum utility containers are silicon lined (acting as a thermal barrier) with heat escape vents for heat dissipation or other apertures. The aluminum container is designed for high temperature styling tool applications such as curling irons or flat-irons (which can exceed 425 degrees).
A second aluminum utility container is open and intended to hold varying sizes of hairdryers with diffusers.
A third aluminum utility container is unlined with a slotted bottom to allow for hair and other debris to fall through the container.
The exterior 10 amp (or alternative amperage) power strip with exterior 'On/Off' switch may be attached to a power receptacle at the base of the chair and may be coupled to an accordion extension cord (or equivalent).
Any unused receptacles on the power strip may be covered and protected with a plastic electrical cap or its equivalent.
An optional removable polymer (or equivalent material meeting local jurisdictions Cosmetology Codes) tray accessory is mounted to the 'rail system' via the previously mentioned hooks.
The tray measures approximately 12" wide and 10" wide 1" deep.
It is segmented in to different sections for use as designated by the stylist.

FIG. 1 shows a typical styling station 101 with chair 102, styling equipment 103 and dangling cords 104. As can be seen the electrical styling equipment is kept separate (typically on a bench or counter) from the chair, and during use the stylist must travel back and forth between the chair and the workstation to pick up, or return a piece of equipment resulting in unnecessary repetitive motions of reaching, bending and/or over stretching.

Figure 2:
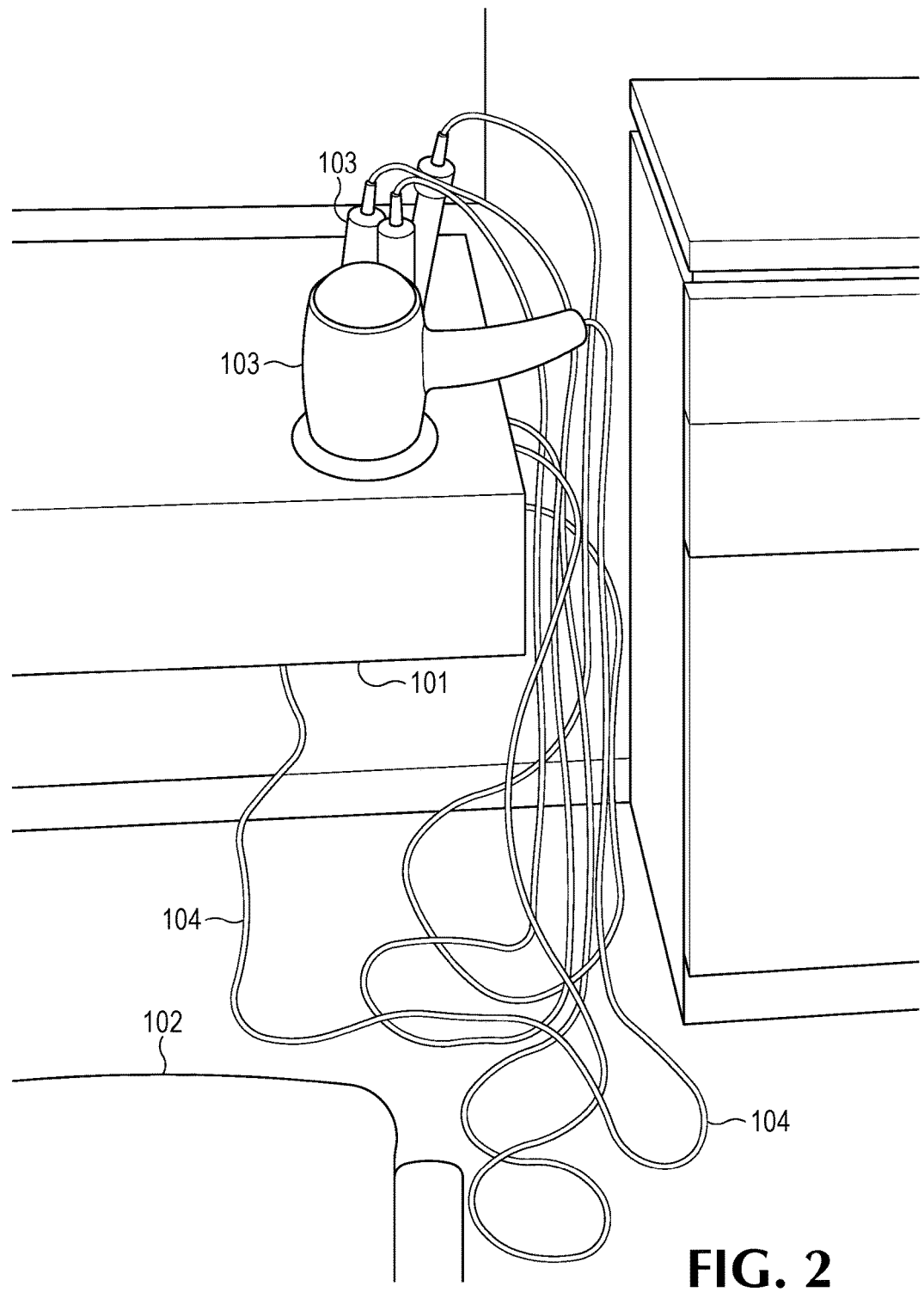
FIG. 2 shows a close-up typical work station and styling equipment and dangling cords.

FIG. 2 shows a close-up typical work station 101 and styling equipment 103 and dangling cords 104. The cords present an untidy clutter, and tend to twist and tangle during use. Often the stylist will pause work to attend to a tangled or twisted cord. Additionally the cords lying on the floor create a safety hazard as they may be a trip and/or fall hazard. Clients also prefer not to have the interference of cords crossing over them as they sit in the styling chair. Accordingly it would be desirable to provide a work station with an improved appearance that eliminates cord clutter, and keeps the stylist tools close at hand, and also allows a high degree of customization for the stylist, which ultimately allows better results to be achieved for the customer. In the following paragraphs a styling chair with an integral rail system and various attachments (FIGS. 3-17), and a retrofit caddy system (FIGS. 18-32) will be described that provide a ergonomic solution to alleviate such clutter.

Figure 3:
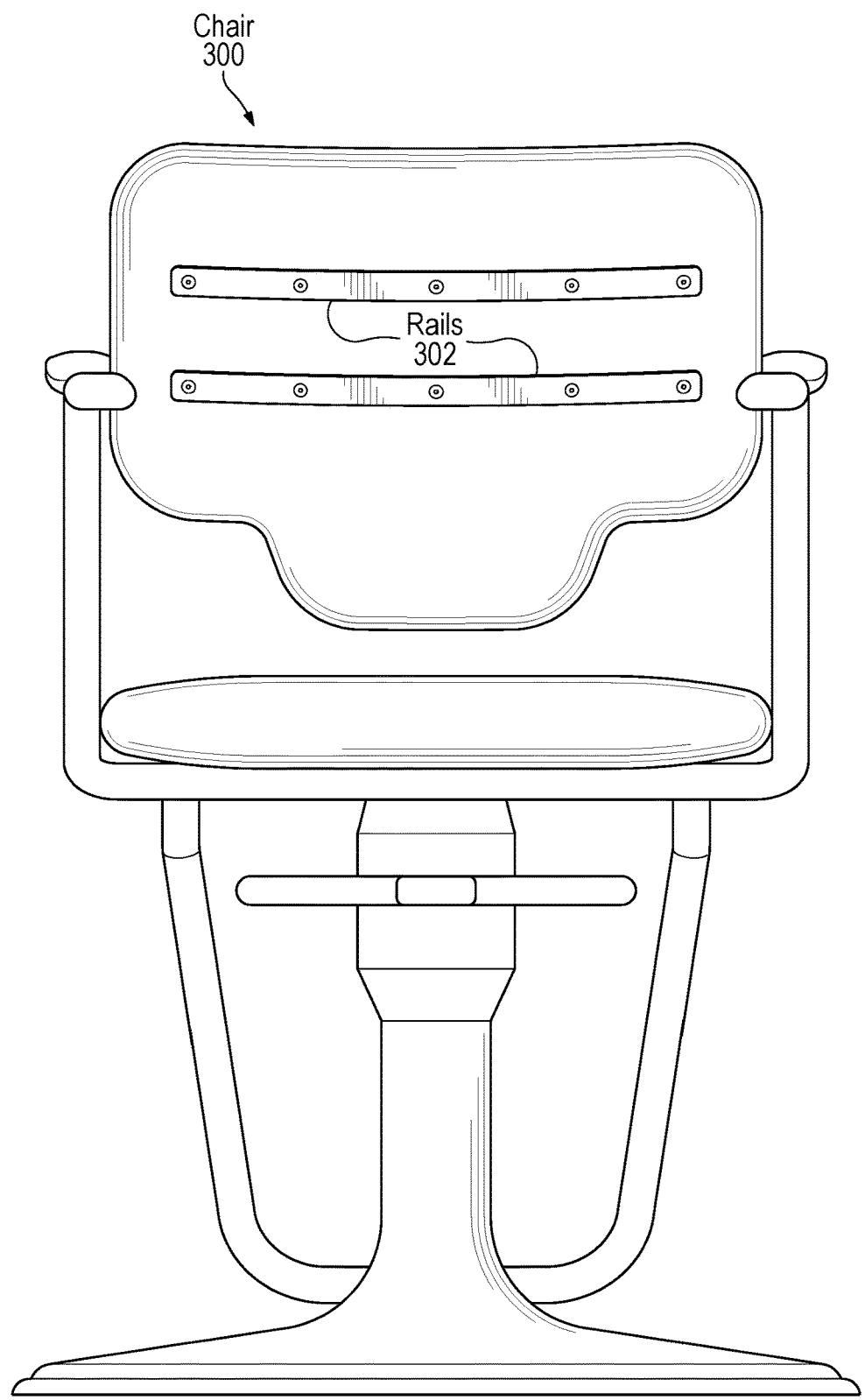
FIG. 3 shows a rear view of salon chair with utility 'rail system' featuring two sets of heavy gauge aluminum (or equivalent materials) rails anchored to the inner support structure of the chair back.

FIG. 3 shows a rear view of salon chair 300 with utility 'rail system' featuring two sets of heavy gauge aluminum (or equivalent materials) rails 302 anchored or otherwise coupled by methods known to those skilled in the art to the inner support structure typically found in the chair 300 back. THE rails advantageously allow the mounting of a plurality of items described herein to aid a stylist or the like servicing a customer or patient sitting in the chair.

Figure 4:
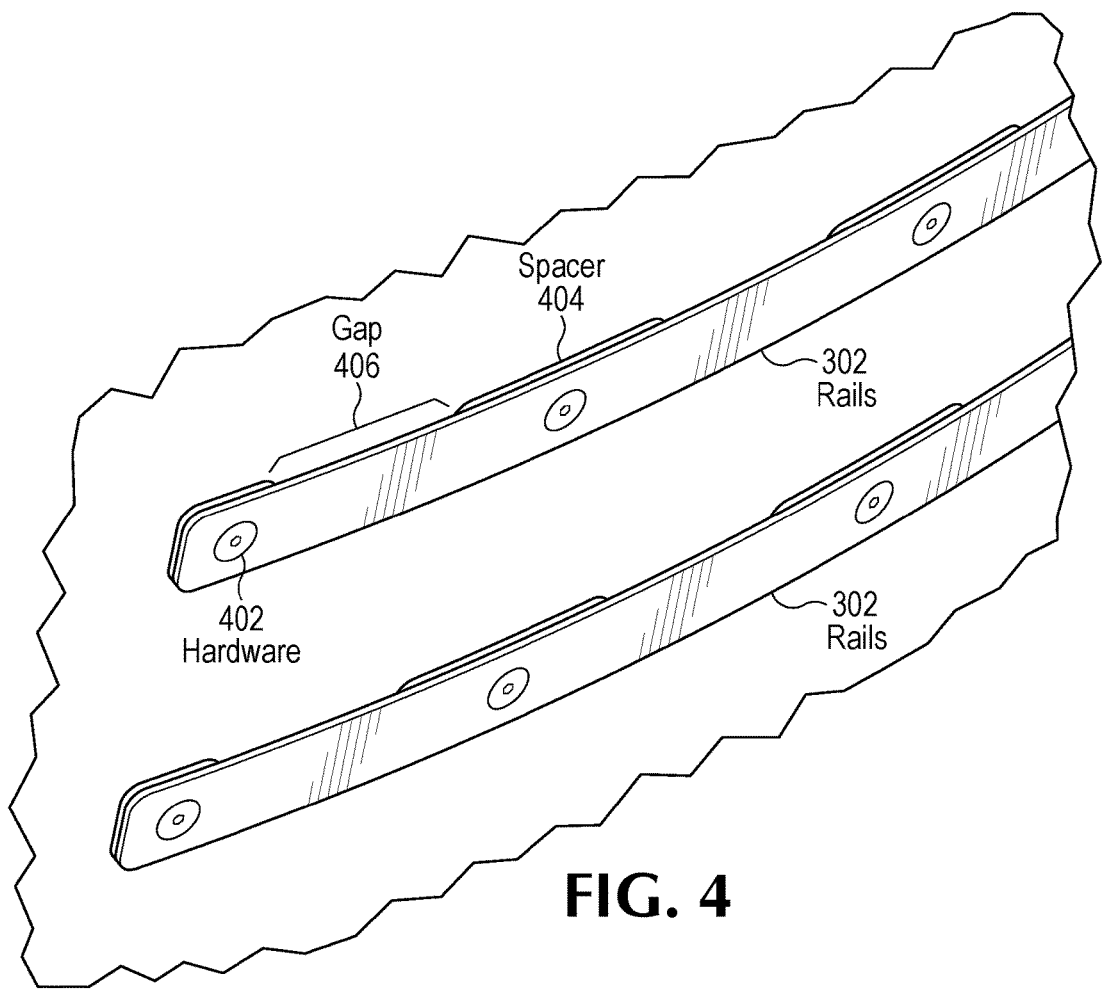
FIG. 4 shows a rear close-up view of salon chair with utility 'rail system'.

FIG. 4 shows a rear close-up view of salon chair with utility 'rail system'. Conventional hardware 402 may be used to couple the two rails (metal or equivilent) 302 to the back of the chair. Here screws are shown, however other equivalent methods of attachment may be used. The chair is preferably supplied with a conventionally constructed internal support structure (not shown) to facilitate by placement of the supports, attachment of the rails to the back, and support the weight of the attachments hanging from the rails. Spacers 404 may be disposed between the rails and the chair back in order to provide a lip on the rails so that accessories such as cups and the like may be hooked over the rails in gap areas 406 where the spacers are not present. The spacer is typically held in place between the rail and seat back by the hardware. Alternatively the rails may be supplied with integral spacers. Also the hardware preferably is flush with an outer surface of the rail in order not to interfere with mounting of accessories, and to provide a streamlined appearance. Alternatively the rails may be formed as part of the chair back.

Figure 5:
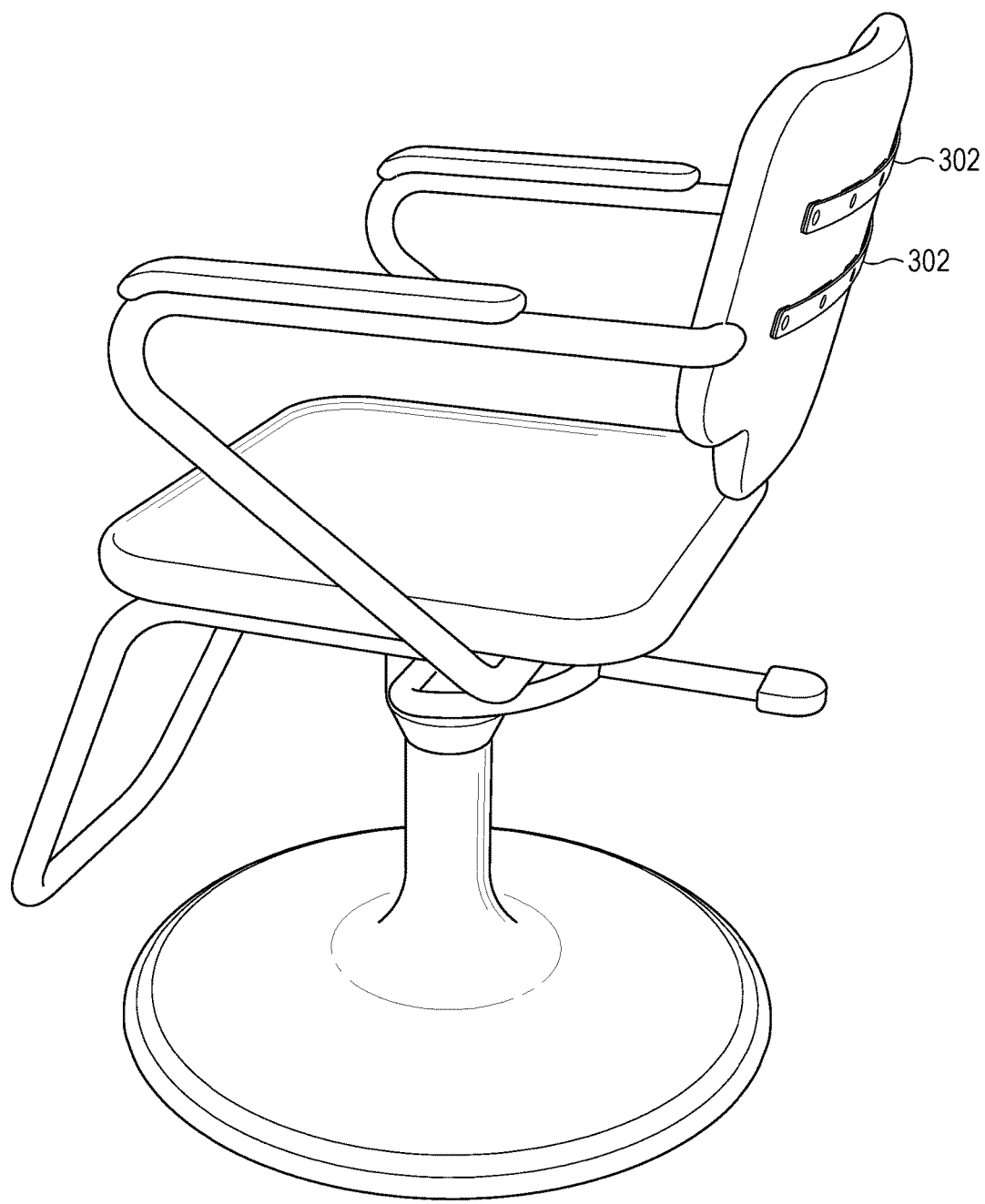
FIG. 5 shows a side view of salon chair with utility 'rail system'.

FIG. 5 shows a side view of salon chair with utility 'rail system'. The rails 302 are constructed to conform to the chair back, and are amenable to curved, straight backs or the like. Here the rails are shown affixed to a curved chair back.

Figure 6:
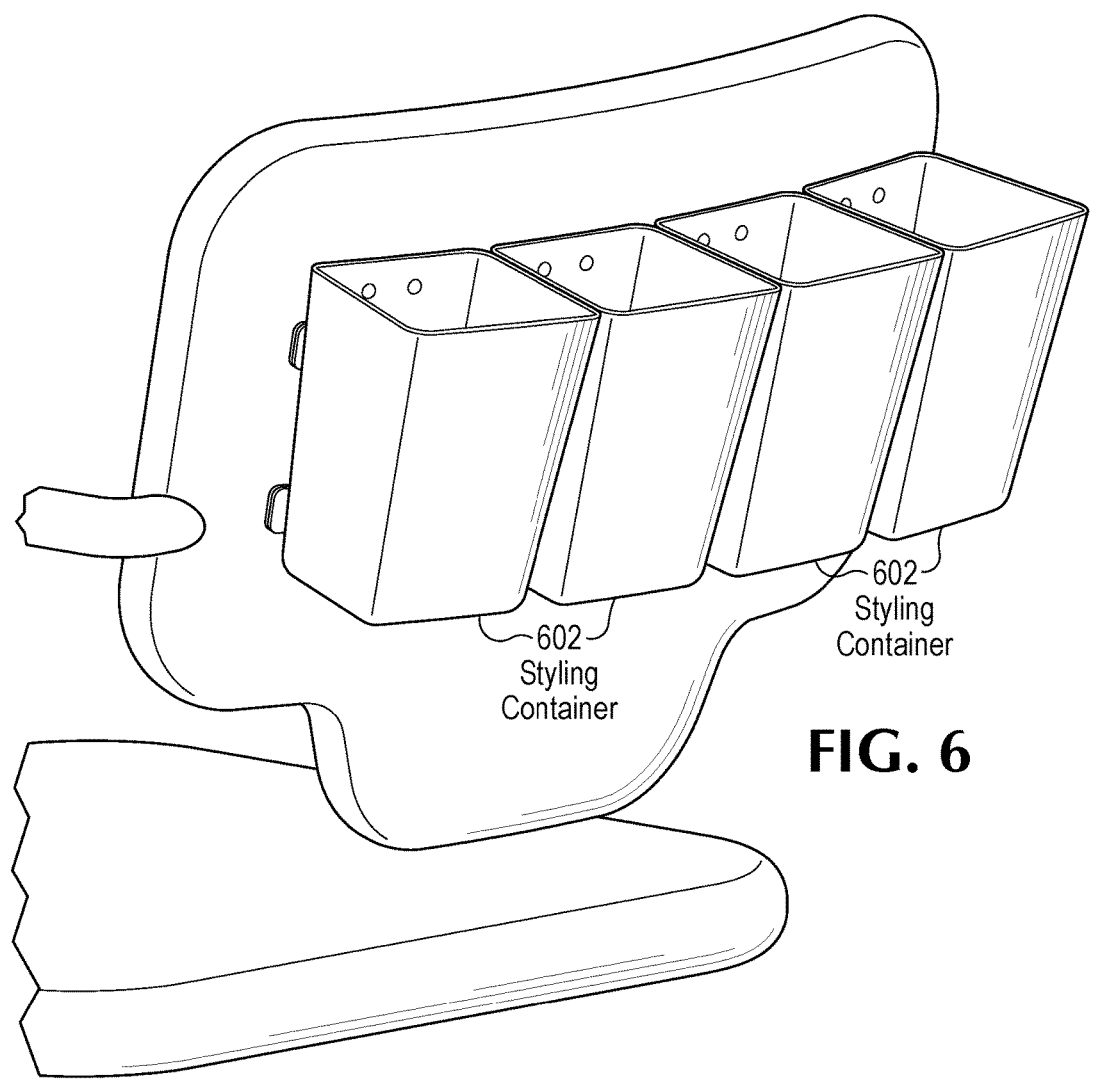
FIG. 6 shows a rear view of salon chair with utility 'rail system' with utility styling containers attached.

FIG. 6 shows a plurality of styling containers 602 removably attached to the rails 302. Any number of styling containers or attachments may be affixed to the rails, typically by sliding a bracket or clip affixed to the back of the container over the rail. The containers may be adjusted contiguously, or spaced apart on the rails as desired.

A typical application consists of four utility containers for equipment and various styling applications (such as hair dye containers). One or more containers may be attached to the rails, along the length of the rails. The containers need not be the same size, and other components may be mounted in conjunction with or instead of the containers shown. Also the containers need not be touching each other and may be spread out along the rails. The containers may include mounting brackets for hooking or sliding over the rails. The brackets may be stamped from the container, or may be added pieces, coupled to the container by conventional methods known to those skilled in the art. The containers may be metal, plastic, typically a high density polymer, aluminum or of any suitable material. In addition they may be lined with silicon—in particular for uses where the container holds substances such as hair dye and the like. The finish may be bare metal or plastic, or they may be painted coated, or otherwise finished to achieve a desired appearance.

Figure 7:
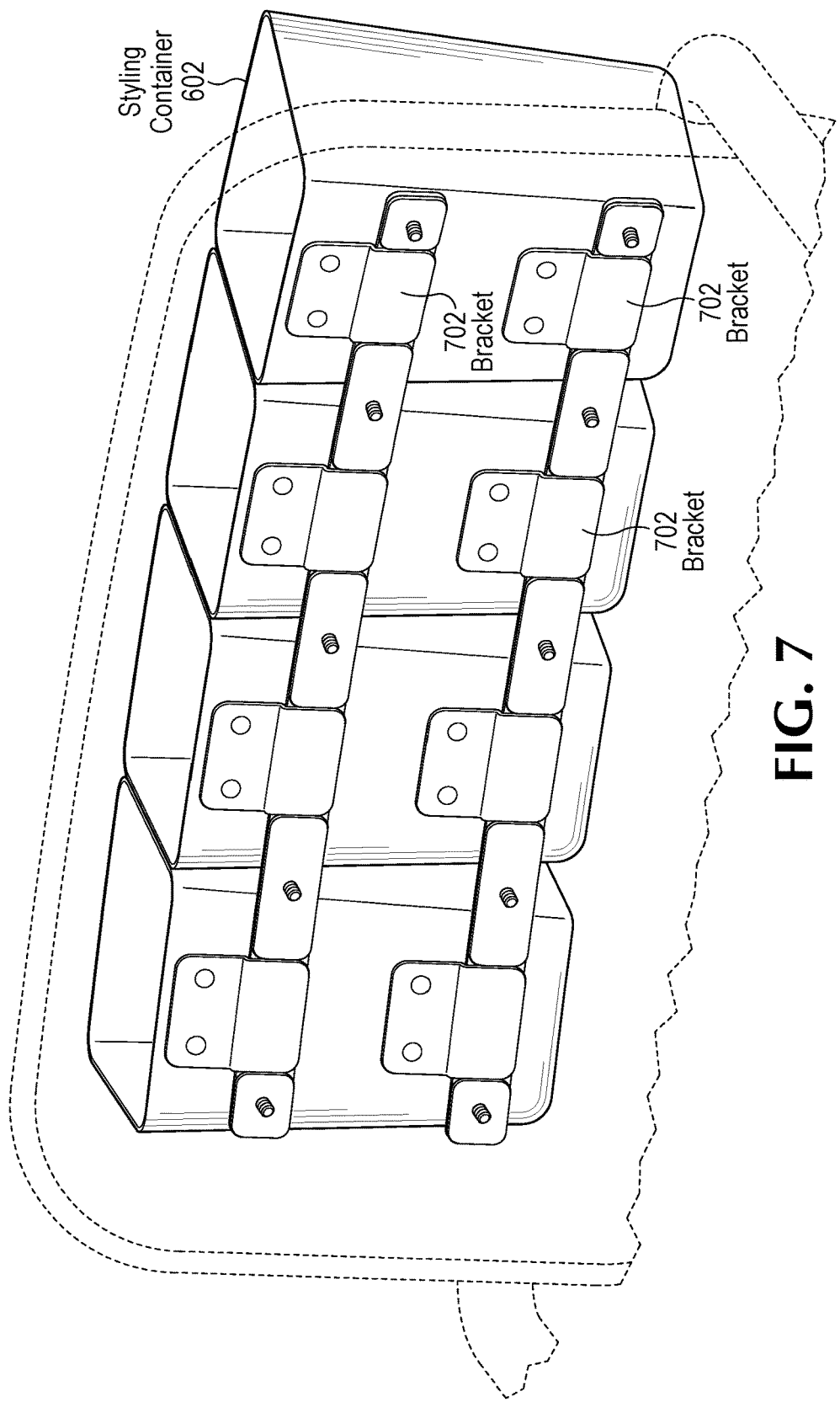
FIG. 7 shows a rear view (with transparent glass chair back for clarity) and details of the positioning of the rail system functioning to support the utility styling containers.

FIG. 7 shows a rear view (with transparent glass chair back for clarity) and details of the positioning of the rail system functioning to support the utility styling containers. Brackets 702 retain the container 602 to the rails 302. The brackets shown are generally rectangular in shape, with an offset bend substantially across a center portion. One portion of the offset is coupled to the container, while the offset end stands off of the container. The offset portion hooks over the rail. Here the brackets 702 have a width that is substantially equal to the gaps between the spacers to provide uniform container spacing, however this is not required. The offset construction of the brackets is further shown in FIG. 9.

Figure 8:
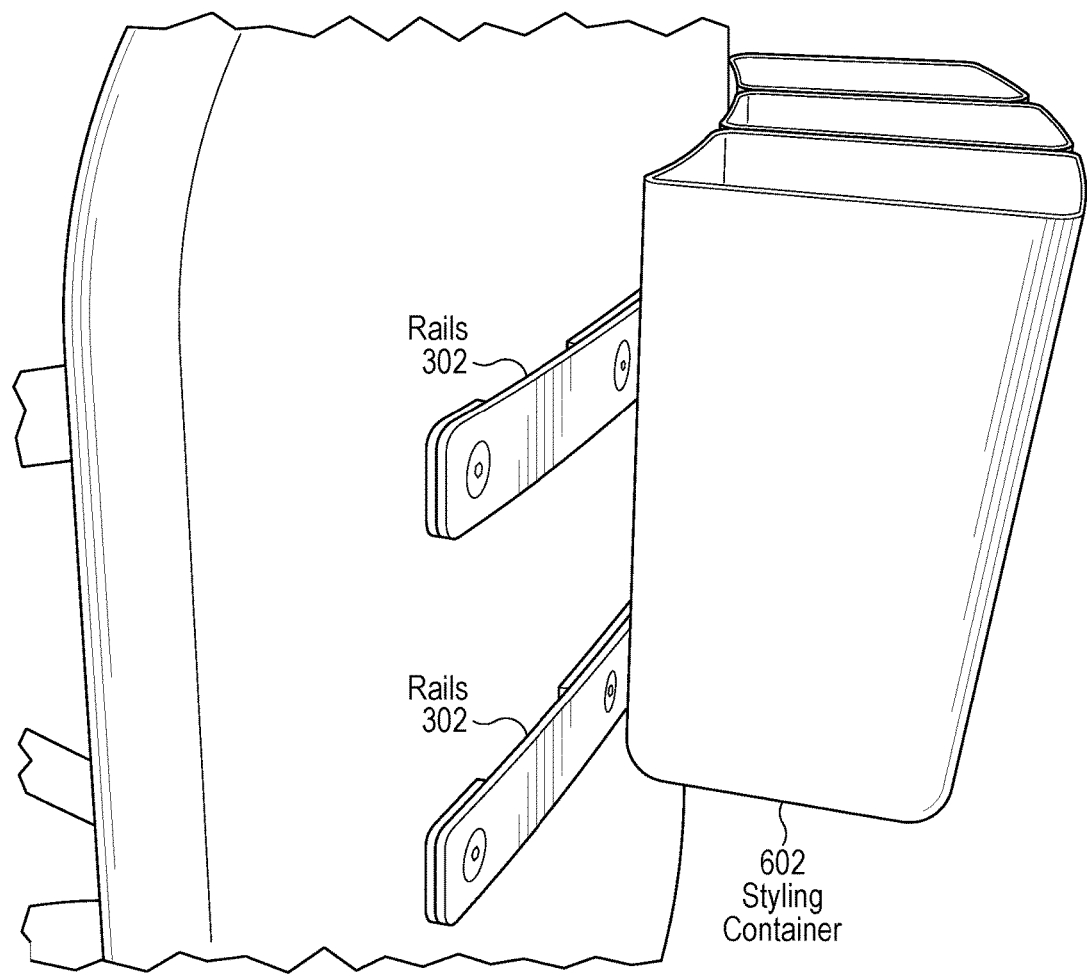
FIG. 8 shows details of the attachment hooks for the 'rail system'.

FIG. 8 shows details of the attachment hooks for the 'rail system'. Here the containers 602 are shown attached to the rails 302 from the side.

Figure 9:
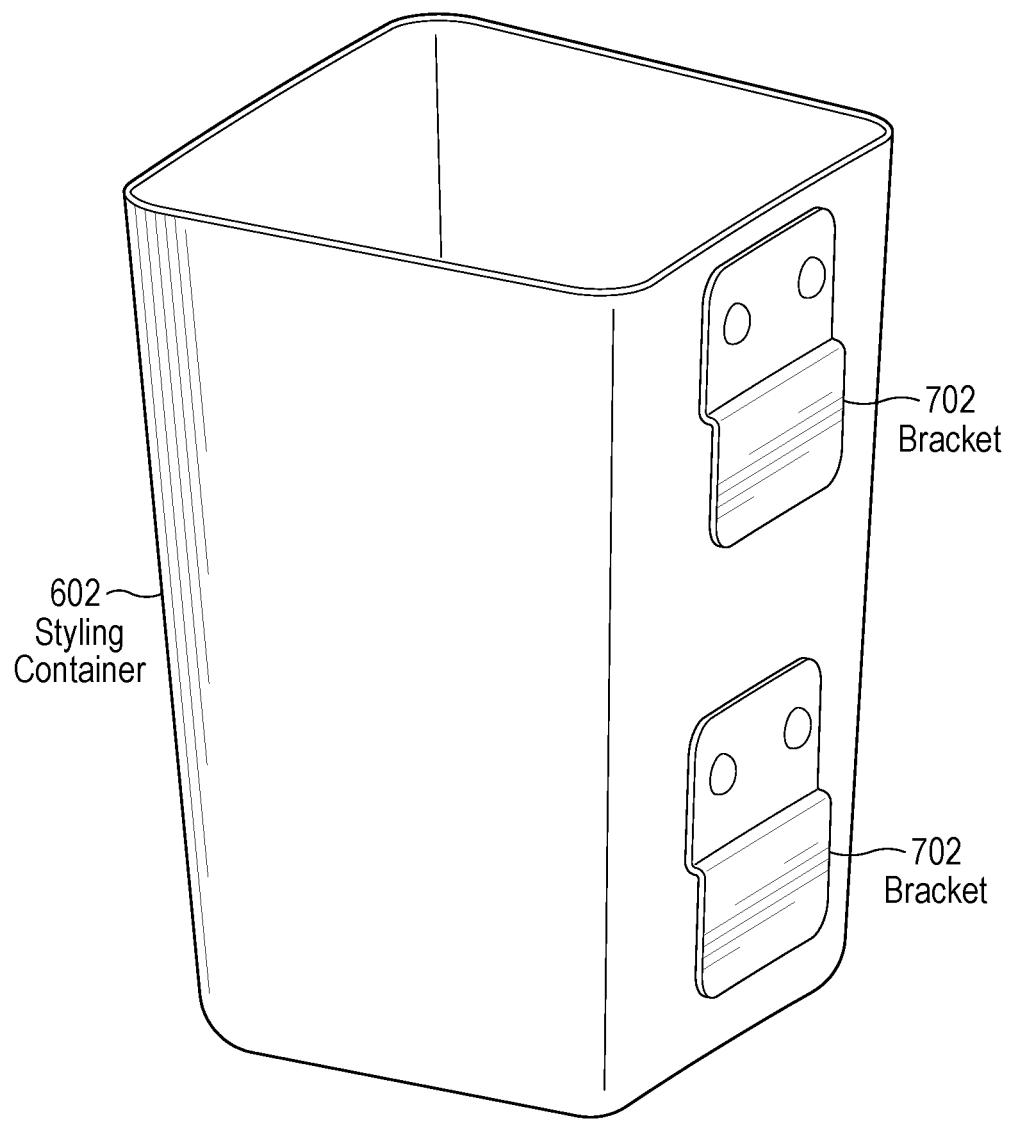
FIG. 9 shows an individual utility container with attachment hooks/brackets.

FIG. 9 shows an individual utility container 602 with attachment hooks/brackets 702. Typically two brackets are provided, substantially in vertical alignment with each other. The brackets may be coupled to the container by any suitable method of attachment. Alternatively the brackets may be integrally formed as part of the container 602.

Utility Container Design (dimensions are exemplary and not limiting): The largest container measures 4-4½" length, 3¼" wide, graduating length graduating from 6" to 5". It is constructed of aluminum (or equivalent material-metal or non-metal), silicon lined or similar material with ventilated sleeves (for heat dissipation and thermal protection). It is designed for curling irons and flat irons which can exceed 425 degrees Two containers 4-4½" length, 3¼" wide, graduating length from 4" to 3¼" wide with a rounded corner to fit inside the aluminum caddy) are designed with an open bottom (designed to hold varying sizes and lengths of blow dryers. The two containers are designed for placement on either the right or left handed side of the aluminum caddy frame to accommodate either a left or right handed stylist.

One container measures 4-4½" length, 3¼" wide with a graduating height of 3' to 2¾". It is designed with an inset wipe bar for hair dye application.

The container has a lid with an opening designed to hold a hair dye brush when not in use.

Figure 10:
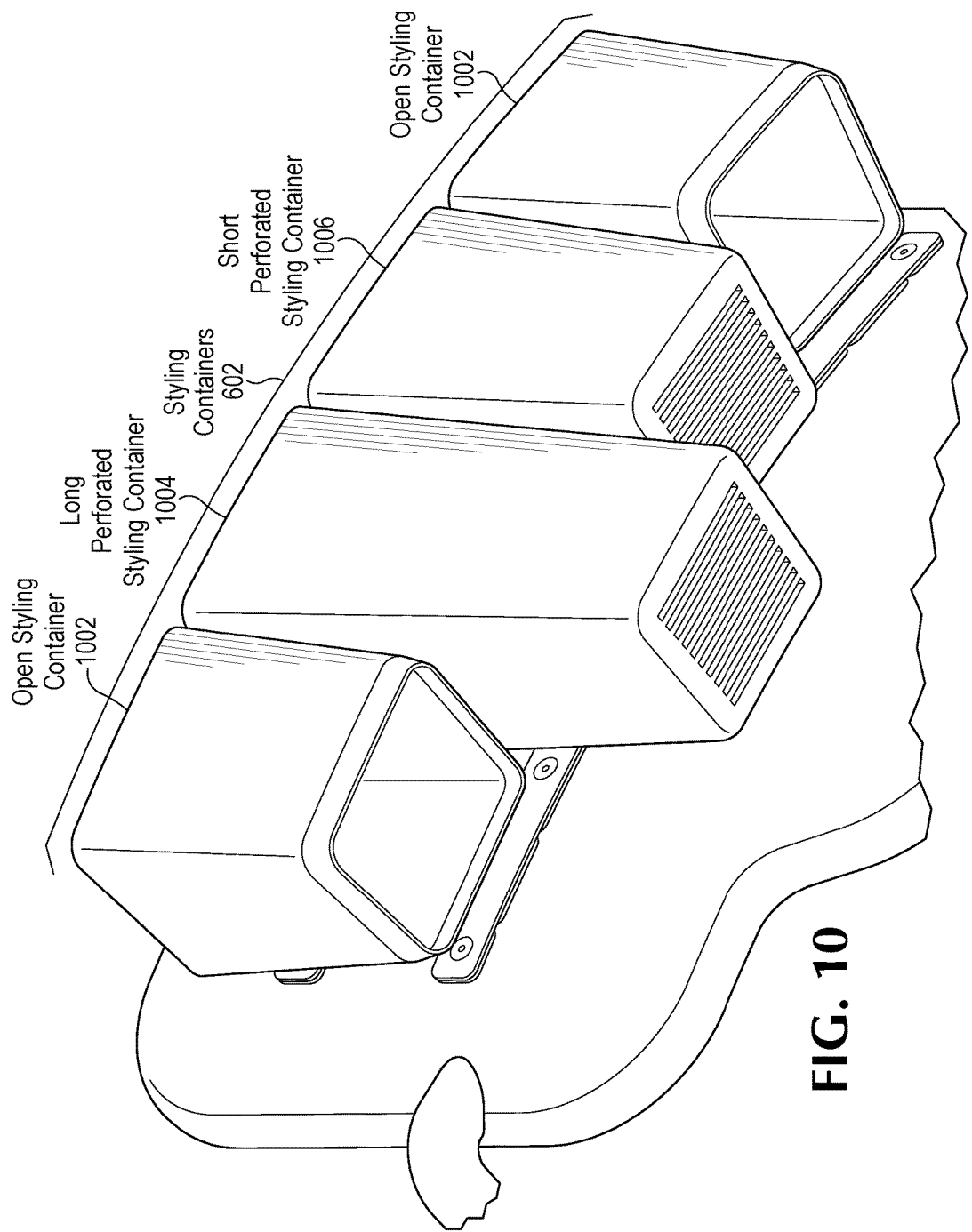
FIG. 10 shows a bottom view of multi-use utility containers attached to the 'rail system'.

FIG. 10 shows a bottom view of multi-use utility containers attached to the 'rail system'. Here an open bottom container 1002, a long container with a perforated bottom 1004, a short container with a perforated bottom 1006, and a second open styling container 1002 are shown as examples. Various other configurations may be provided as the containers may be rearranged and user configured to suit individual taste of function of the work station. Here the open containers 1002 may be used to hold blow dryers or the like. Containers with a solid bottom may be used to hold liquids, gels or the like, including small item that might fall through a slotted bottom container. Bottom perforations tend to provide ventilation and drainage for items stored therein.

This view shows various exemplary styling containers 602. An open bottom container 1102 may be provided to hold blow dryers and the like. Long 1004 and short 1006 containers may be perforated at the bottom surface to prevent small objects from falling through.

Figure 11:
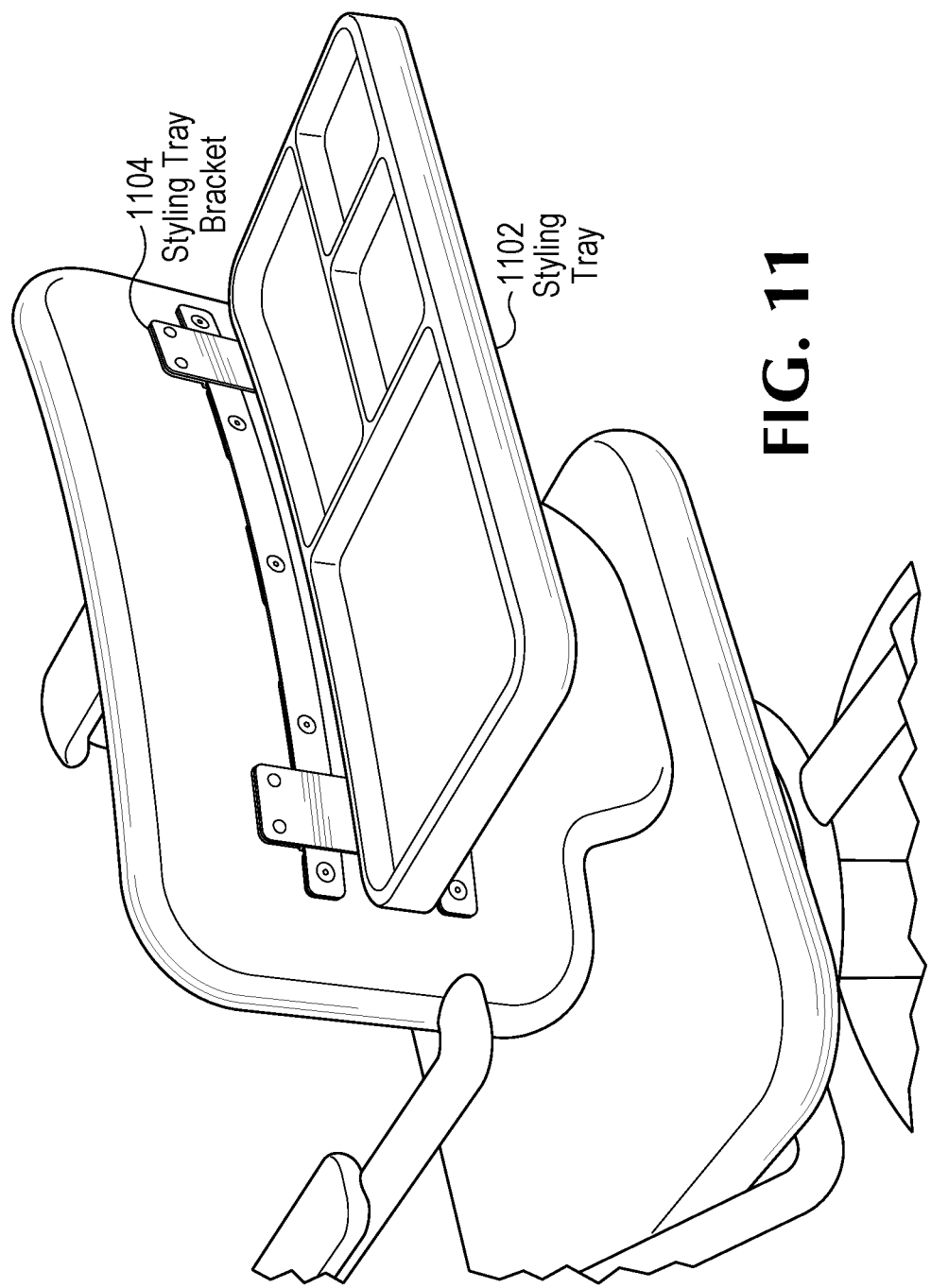
FIG. 11 shows a top view of an optional accessory styling tray attached to 'rail system'.
Figure 12:
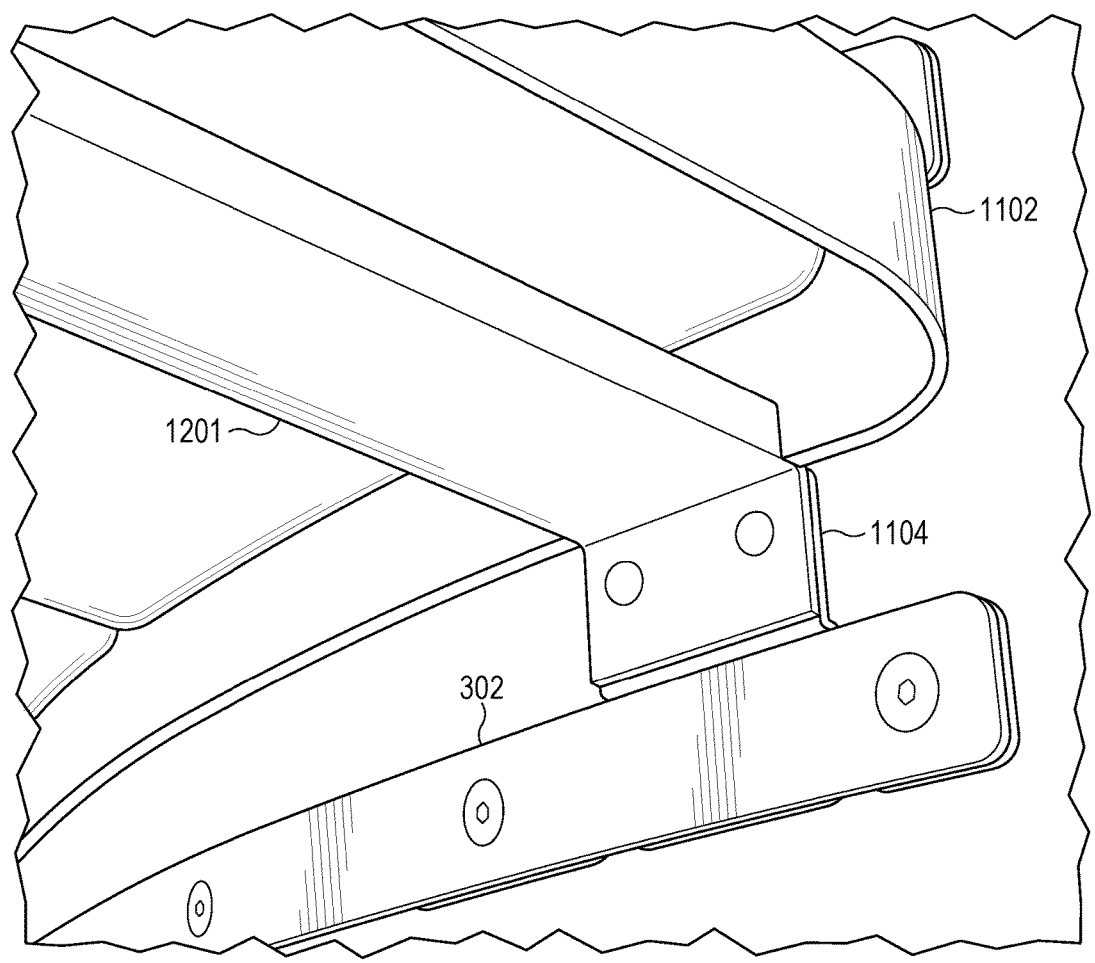
FIG. 12 shows a close up view of the optional accessory styling tray attached to 'rail system'.

FIG. 11-12 show an exemplary styling tray 1102 mounted on the back of a stylist chair. The stylist tray includes brackets 1104 that allow attachment of the tray to the stylist chair rails. The tray may be compartmented, or may alternatively provide a flat interior surface. The tray may be plastic, metal or the like. The top brackets shown in FIG. 11 hook over the corresponding rail, and the bottom row of brackets include tabs for insertion between the seat back and the rails.

FIG. 11 shows a top view of an optional accessory styling tray attached to 'rail system'. A styling tray 1102 may include brackets 1104 that hook over the rail system (here the top rail, but equivalently the bottom rail may be utilized. and provide a removable tray option. The tray may be compartmentalized or flat-typically with an edge or lip to retain objects from falling off. The tray may be constructed from any suitable material. The brackets may extend from the top as shown or extend below the tray surface in alternative examples. In alternative examples a support may be provided that couples to a lower rail.

FIG. 12 shows a close up view of the optional accessory styling tray attached to 'rail system'. The tray 1102 includes a bracket 1104 that may be integral to an under tray support

1201. Here the bracker is inserted into the gap between the rail 302 and the chair back, with a lip on the bracket contacting a top surface or the rail 302.

Figure 13:
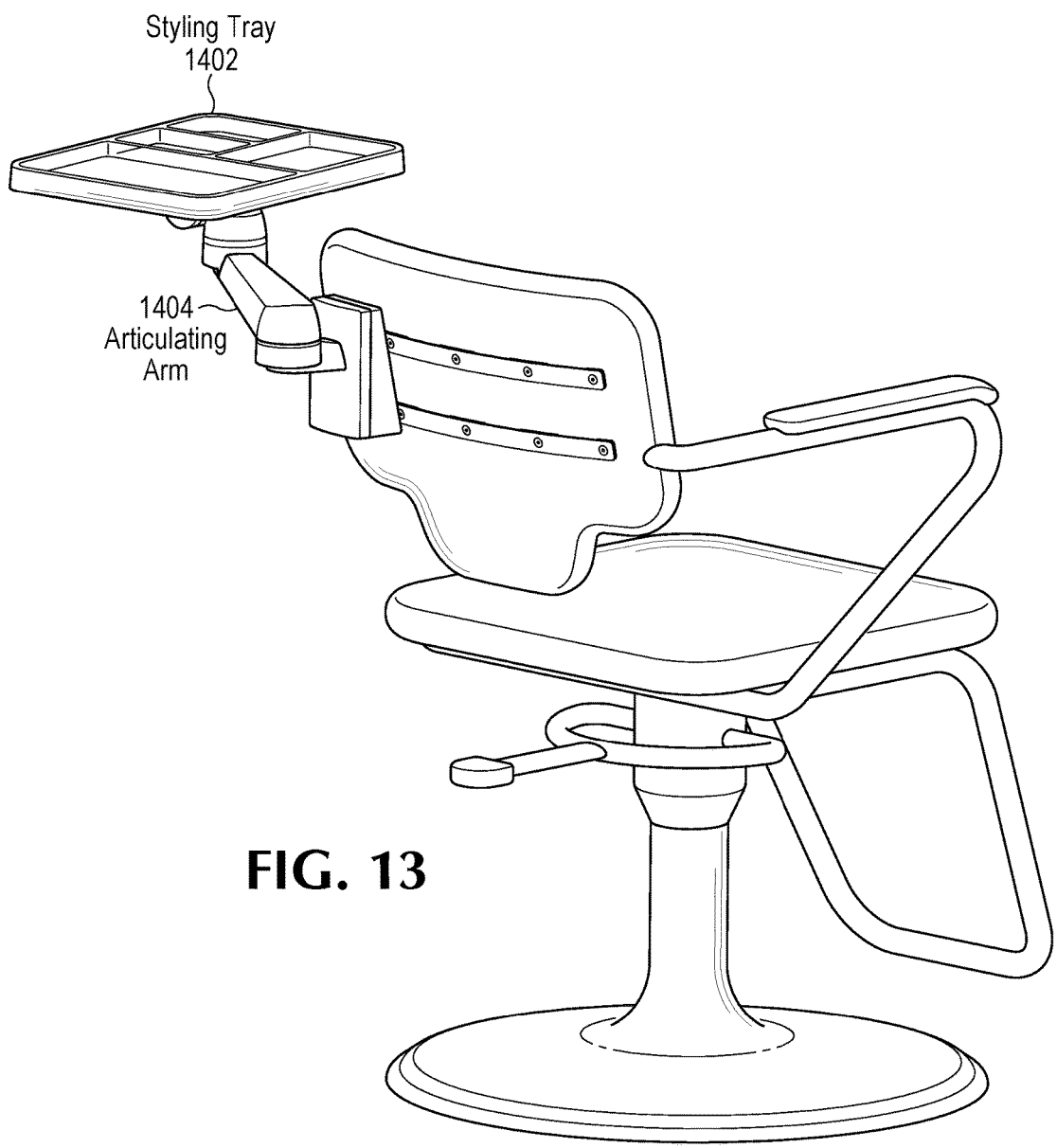
FIG. 13 shows the optional articulating arm coupled to the chair's 'rail system'.
Figure 14:
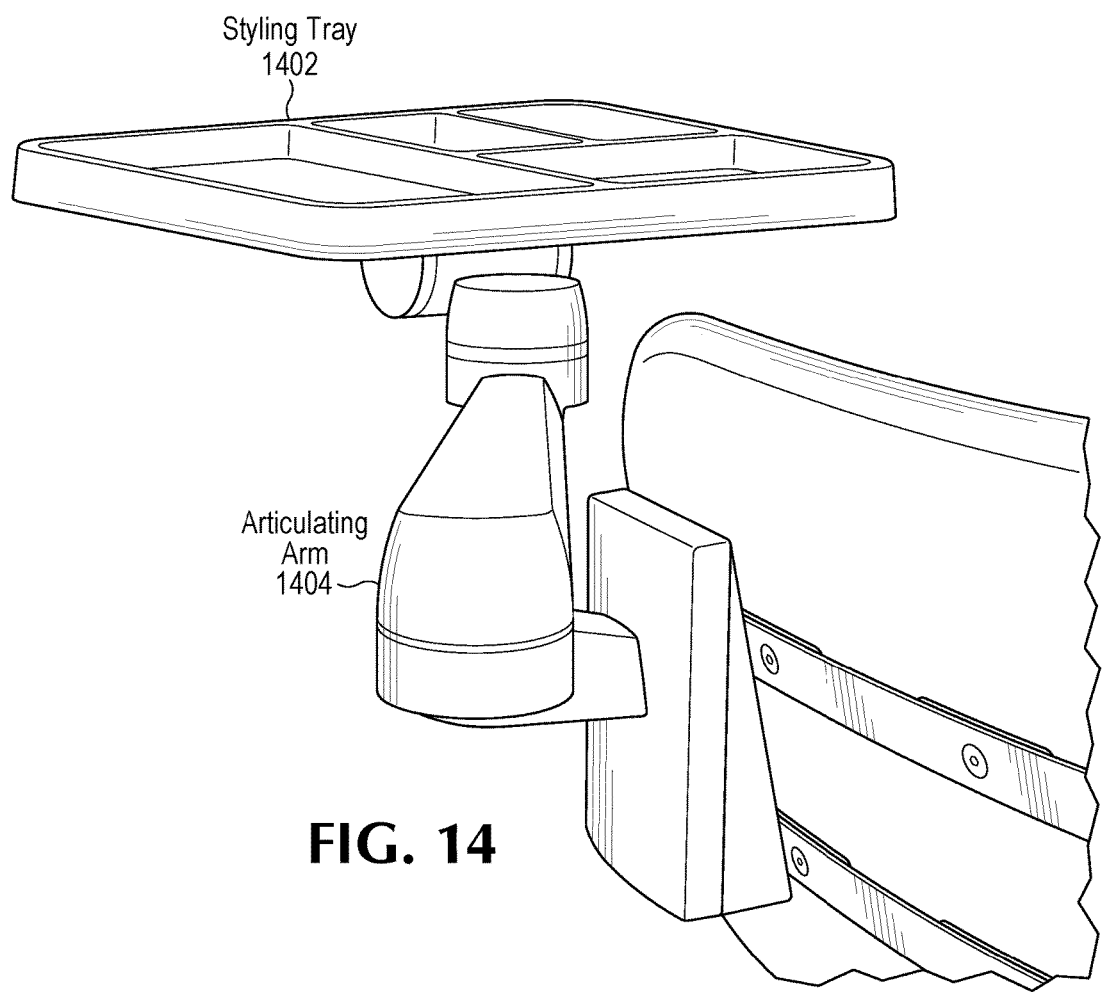
FIG. 14 shows a close up of an optional articulating arm coupled to the chair's 'rail system'.
Figure 15:
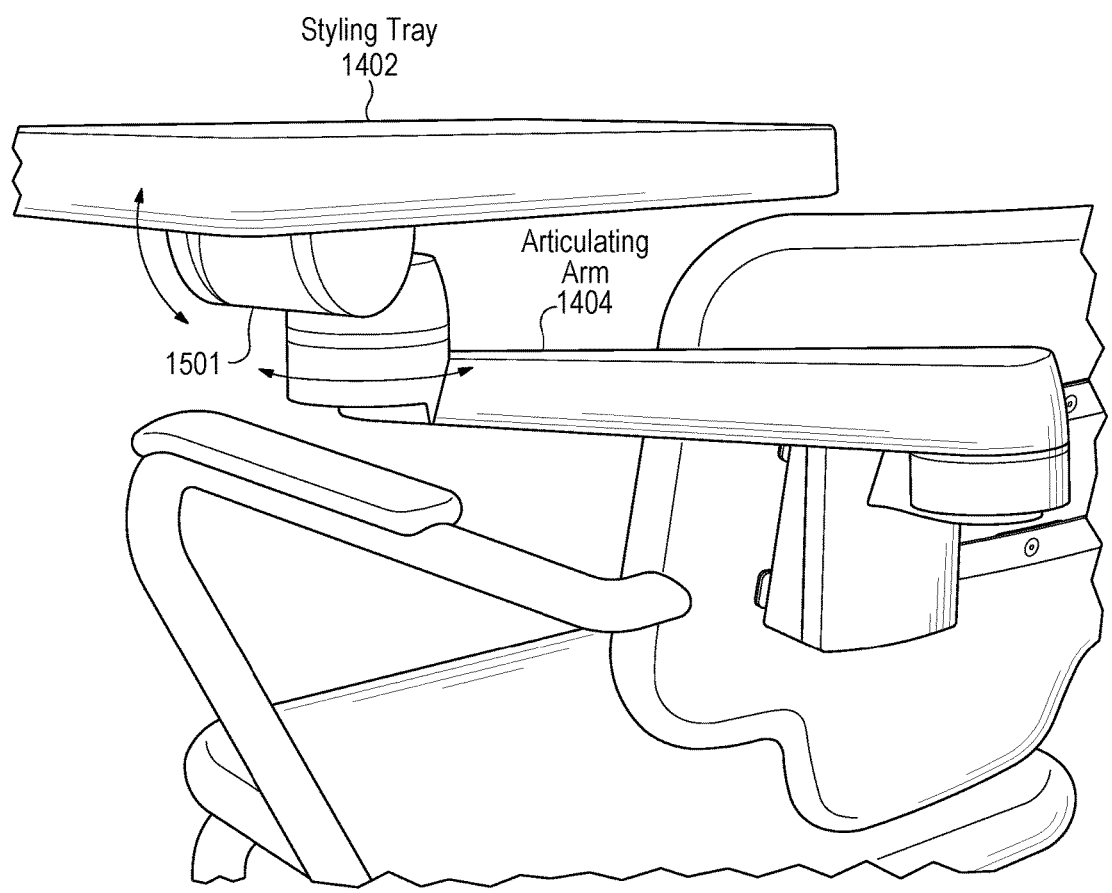
FIG. 15 shows a side view of the optional articulating arm attached to the chair's 'rail system'.

FIGS. 13-15 show a tray 1402 similar to that previously described, but mounted at the end of an articulating arm 1404, to allow further stylist flexibility. The arm may include a plurality of pivot points to position the tray 1402. The tray may be tilted using the pivot mechanism closest to the tray 1501. And the tray may be positioned in the horizontal plane by the remaining two pivot points. In alternative examples a mechanism for elevating the tray may also be provided. The arm and pivot points are constructed utilizing methods known to those skilled in the art. The brackets for coupling the arm to the chair back are as previously described regarding FIGS. 11-12. The arm may be made of plastic, aluminum or equivalent.

FIG. 13 shows the optional articulating arm coupled to the chair's 'rail system'.

FIG. 14 shows a close up of an optional articulating arm coupled to the chair's 'rail system'.

FIG. 15 shows a side view of the optional articulating arm attached to the chair's 'rail system'.

Figure 16:
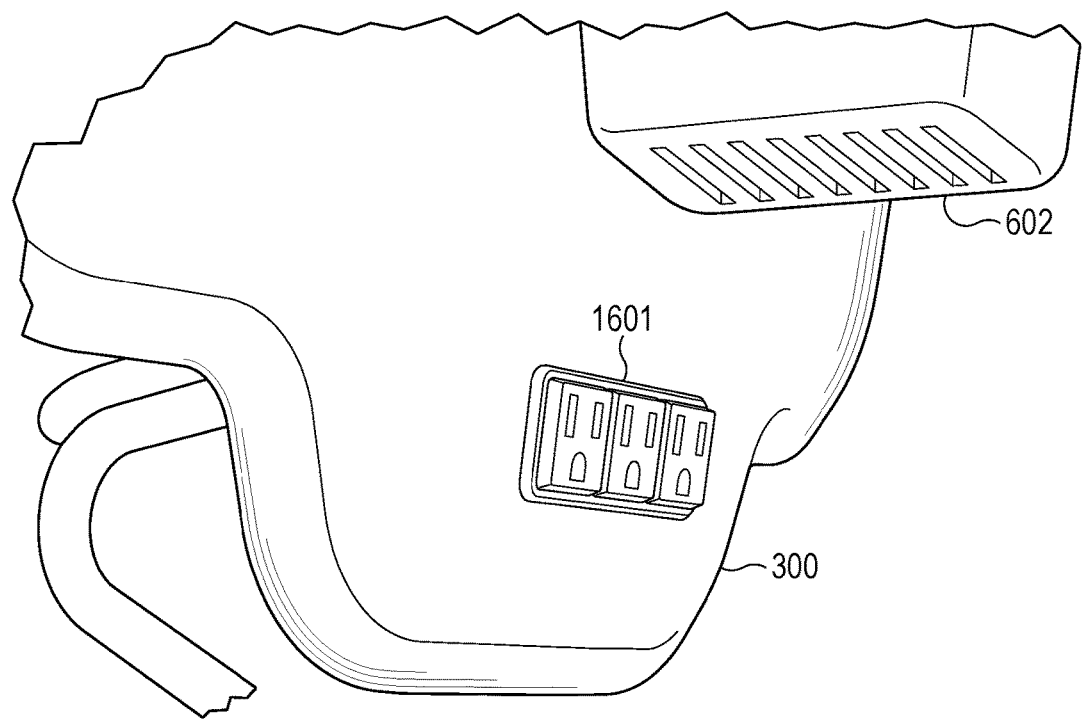
FIG. 16 shows a power hub integral to a caddy.

FIG. 16: Shows an electrically integrated salon styling chair 300 equipped with an integrated permanent power source 1601 at the base of the caddy in the rear back surface of the chair. The chair is designed to provide electrical connections for the cords for a hair dryer, curling iron, razor etc. stored in a rear tool compartment 602 where they are easily accessible during use. The chair is integrated with a typical 15-20 amp power source running from the back of the chair through to the base of the chair. Power may be provided to the chair by several mechanisms described herein so that the functionality of a standard salon styling chair may be maintained.

This product may be offered internationally with the appropriate connectors and power sources as appropriate for the plug configuration in that area.

The need for a safe electrically integrated and ergonomically functional salon/barber styling chair has been designed to alleviate dangling cords and the potential for trips and/or falls (FIGS. 1 and 2) as well as to provide ergonomic access to styling equipment.

The intent of this invention is two-fold: First, the chair may be designed with a permanently integrated 10 amp—or other convenient current value power source for styling equipment (power originates from an electrically integrated power outlet located in the rear of the chair). An optional pigtail power extension—or other suitable electrical coupling from the outlet allows for the chair to be adjusted in an upward or downward position.

Alternative example of a: Power Design for Center Support Structure with Hard Stop (not shown). On the example shown a 360 degree pre-twist on the electrical cord descending the center support structure is provided. By adding a hard stop to the center support, there tends to be little or no potential for damaging the cord. The figure illustrates this hard stop/twist mechanism for the central support structure. Alternatively, electrical contacts may be disposed within the chair to allow contact to be maintained while the operator turns the chair on the center post.

The need for a safe electrically integrated and ergonomically functional salon/barber styling chair has been designed to alleviate dangling cords and the potential for trips and falls (FIGS. 1 and 2) as well as to provide ergonomic access to styling equipment.

The intent of this invention is two-fold:

First, the chair is designed with a permanently attached 10 amp—or other convenient current value—power source for styling equipment (power originates from an electrically integrated power outlet in the equipment caddy located in the rear of the chair). A pigtail power extension—or other suitable electrical coupling—from the outlet allows for the chair to be adjusted in an upward or downward position. The pigtail then transitions to a 10 amp insulated flat cord which extends through the chair infrastructure, down the center chair support to the base of the chair. Alternatively the cord may bypass the interior support and couple the caddy to power available on the floor beneath it, or may be ran down the exterior of the pedestal. The insulated flat cord may be inserted down the hollow center support structure of the chair with a 360 degree pre-twist. This design allows the chair to rotate no more than 360 degrees before the center shaft strikes a 'hard-stop' preventing damage to the cord. The cord has the ability to be permanently affixed to a floor receptacle or the power source is connected to an outlet concealed under a floor cord cover (preventing trips and falls) and connected to an electrical outlet adjacent to the operator's work station.

Figure 17:
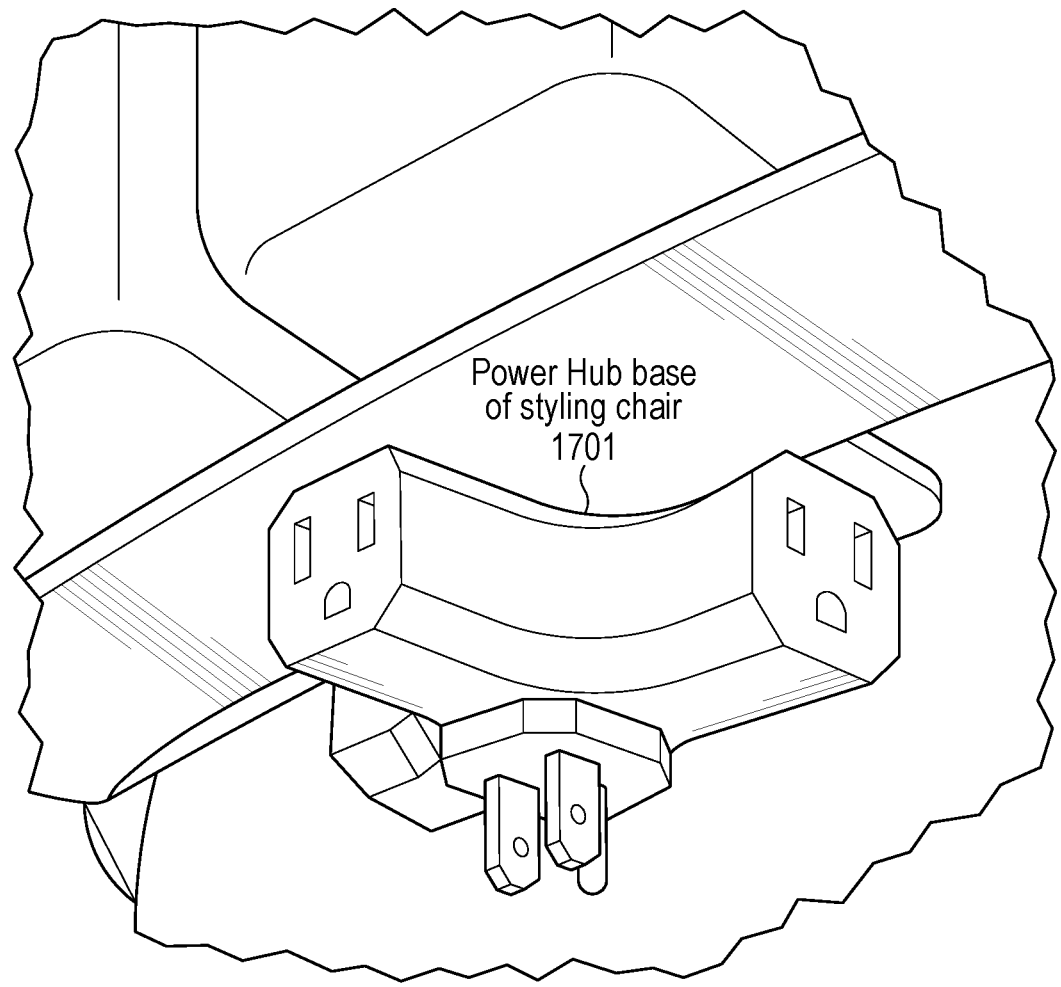
FIG. 17 shows the power hub base of styling chair.

FIG. 17 shows an alternative power connection mechanism of a power distribution fixture 1701 attached to a bracket or ledge just below the styling containers 602. Another option is a multi-outlet pigtail electrical cord connecting the styling equipment that may transition to a 10 amp insulated flat cord which extends from the back of the chair to the base of the chair. Such an exterior 10 amp (or alternative amperage) power strip with exterior 'On/Off' switch may be attached to a power outlet at the base of the chair and may be coupled to an accordion extension cord (or equivalent).

Alternatively an appliance cord may connect to power available on a floor receptacle beneath it, or may be run down the exterior of the pedestal. The cord has the ability to be permanently affixed to a floor receptacle or the power source is connected to an outlet concealed under a floor cord cover (preventing trips and/or falls) and connected to an electrical outlet adjacent to the operator's work station. The rear utility containers and direct electrical source is designed to provide a readily available access to a hair dryer, curling iron, flat iron and razor.

The stylist's chair described above is a self-contained integrated styling system with customizable utility containers, removable work tray and removable articulating arm. All accessories have the capacity/option to be configured as needed at the rear of the chair for immediate access by either a right or left handed stylist/barber.

The chair system described above may be offered as a new protect or retrofitted with an adaptor kit. The adaptor kit may be a stand-alone design or product.

Figure 18:
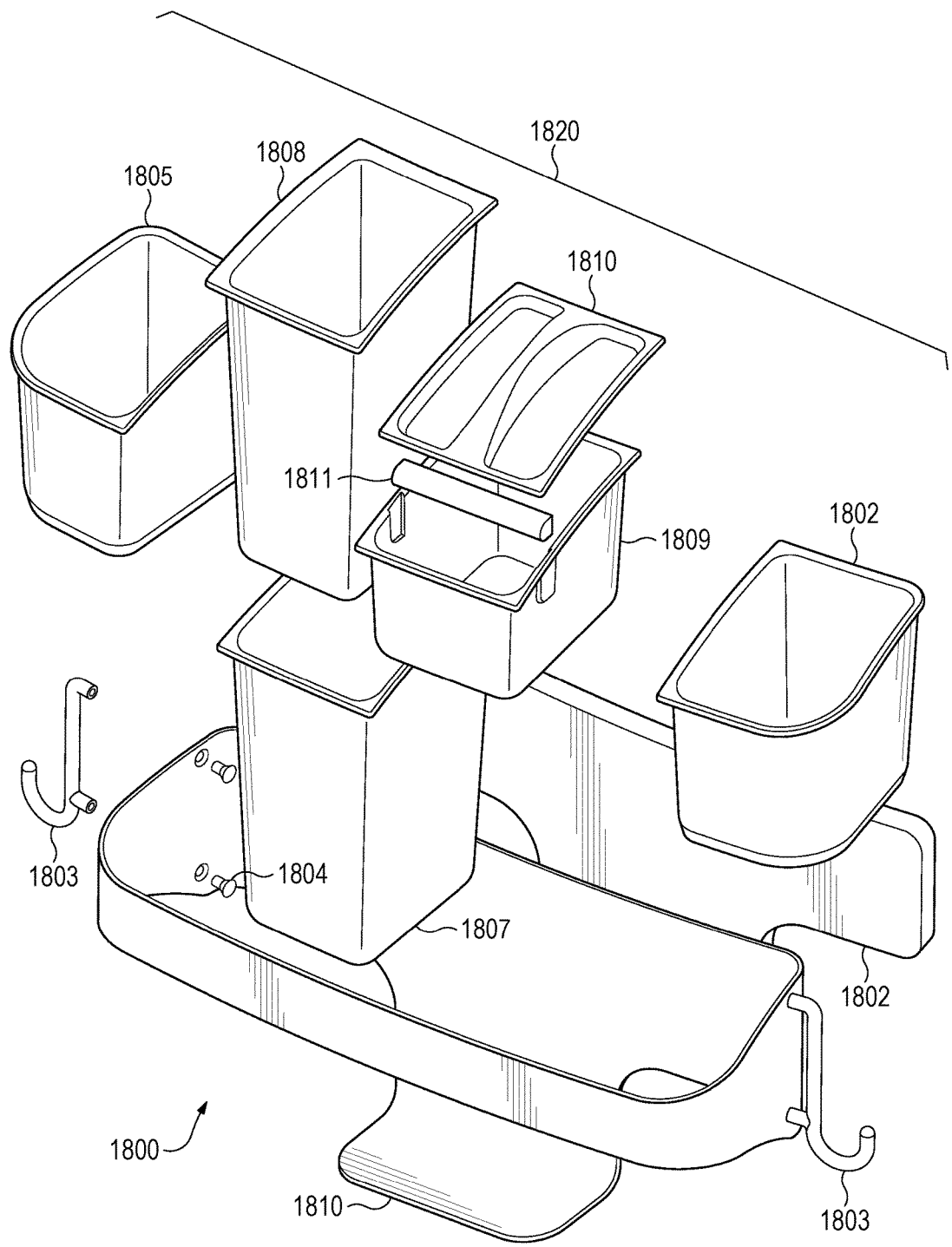
FIG. 18 shows the Equipment Caddy adapter kit. A stylists chair may be offered as a new product or retrofitted with an adaptor kit. The adaptor kit may be a stand-alone design or product.

FIG. 18 shows the Equipment Caddy adapter kit. A stylists chair may be offered as a new product or retrofitted with an adaptor kit. The adaptor kit may be a stand-alone design or product. The adapter includes a frame 1810 that is designed to hold various containers to hold stylists tools and chemicals. It provides hanging hooks 1803 for spray bottles and the like. THE main frame 1810 may be coupled to a seat back spacer 1802. Hangers 1803 are attached to the main frame 1810 by screws or equivalent 1804. The space between the hanger and frame form an aperture to accept a strap or adjustable band (not shown) that encircles the seat back (not shown). THE frame accepts various styling containers 1820, such as right holster, 1805, left holster 1806, long container 1807, and a short container 1809. Long container 1807 may be fitted with a removable liner 1808. Short container 1809 may include a wiping bar 1811 and a lid 1810.

The brackets for the spray bottles are coupled to the frame, and is advantageously constructed to accept a strap (not shown) that wraps around a chair back. The strap is of neoprene rubber or equivalent. The strap bracket/hangers are disposed at opposite ends of the frame 1810. Additional support may be provided by suspender straps (not shown) coupled to the horizontal adjustable band. The suspender straps go over the top of the chair back and support the caddy weight in the vertical direction.

The caddy adapter kit 1800 may be used with a standard stylists chair or with an electrically integrated salon styling chair equipped with an integrated permanent power source in the tool caddy at the rear of the chair. Such a chair, as described elsewhere in this document, may be designed to provide retractable cords for a hair dryer, curling iron, razor etc. stored in a rear tool compartment where they are easily accessible during use. The chair is integrated with a 15-20 amp power source running from the back of the chair through to the base of the chair. Power may be provided to the chair by several mechanisms described herein so that the functionality of a standard salon styling chair may be maintained.

FIGS. 19-26 show the various views of the caddy retrofit kit ("caddy") 1800. The construction of the caddy incorporates many of the design elements described for the integrated salon chair with ergonomic styling system described herein.

Figure 19:
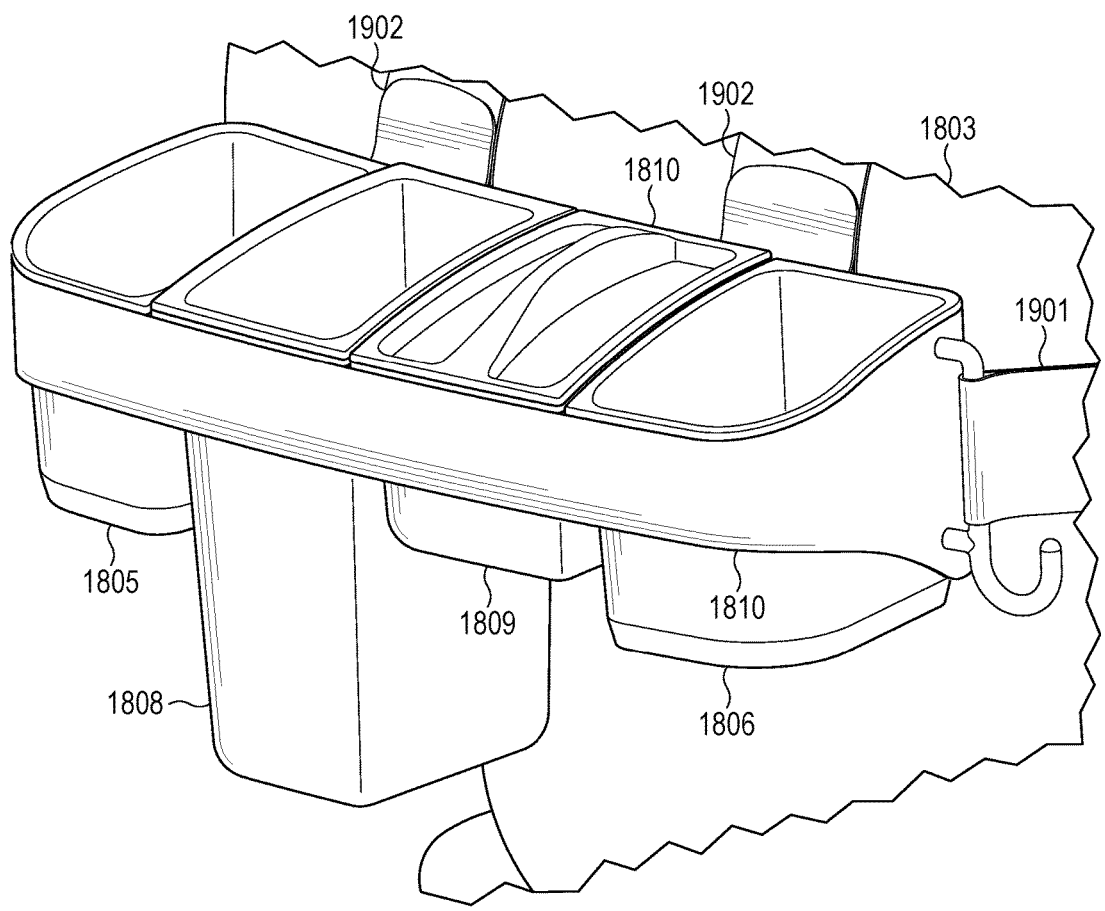
FIG. 19 Rear View of Chair and removable/adaptable Equipment Caddy.

FIG. 19 Rear View of Chair and removable/adaptable Equipment Caddy. The frame 1810 provides support for the containers 1805, 1808, 1809, and 1806. Frame 1810 and hook 1803 form an aperture through which an adjustable strap 1901 may be attached. This view shows optional vertical suspenders 1902.

Figure 20:
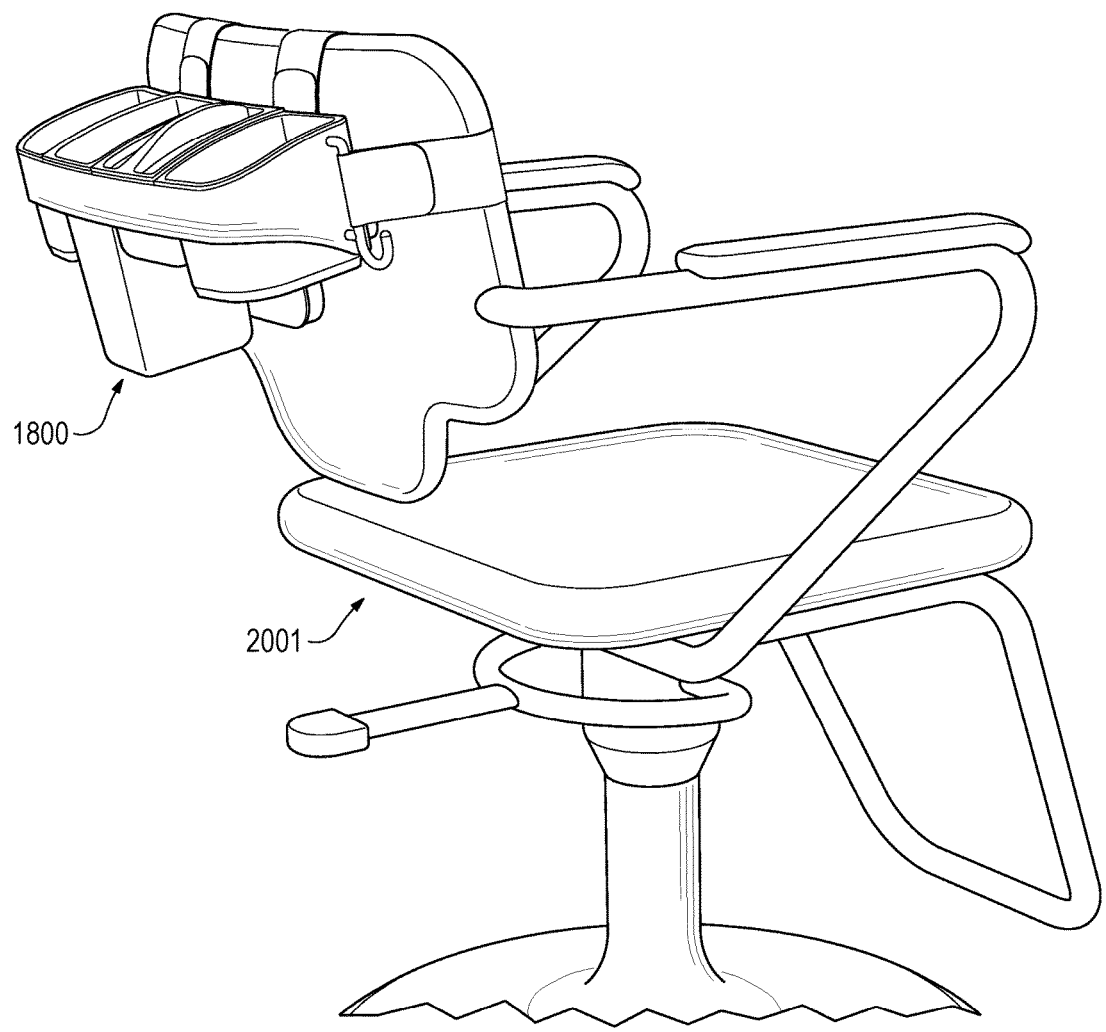
FIG. 20 Side Profile of Chair and Caddy Harness.

FIG. 20 Side Profile of Chair 2001 and Caddy Harness 1800. Here a single band with optional suspender bands which may be made of an elastic material may encircle the back of the chair, and may go over a top of the chair to prevent sagging. The band is secured and adjusted via hook and loop tape (or equivilent) disposed on the band. The containers shown may be silicone lined. And may be equipped with a wiping edge upon which brushes for applying hair dye or the like may be wiped. The band loops through apertures as shown on the caddy back.

Figure 21:
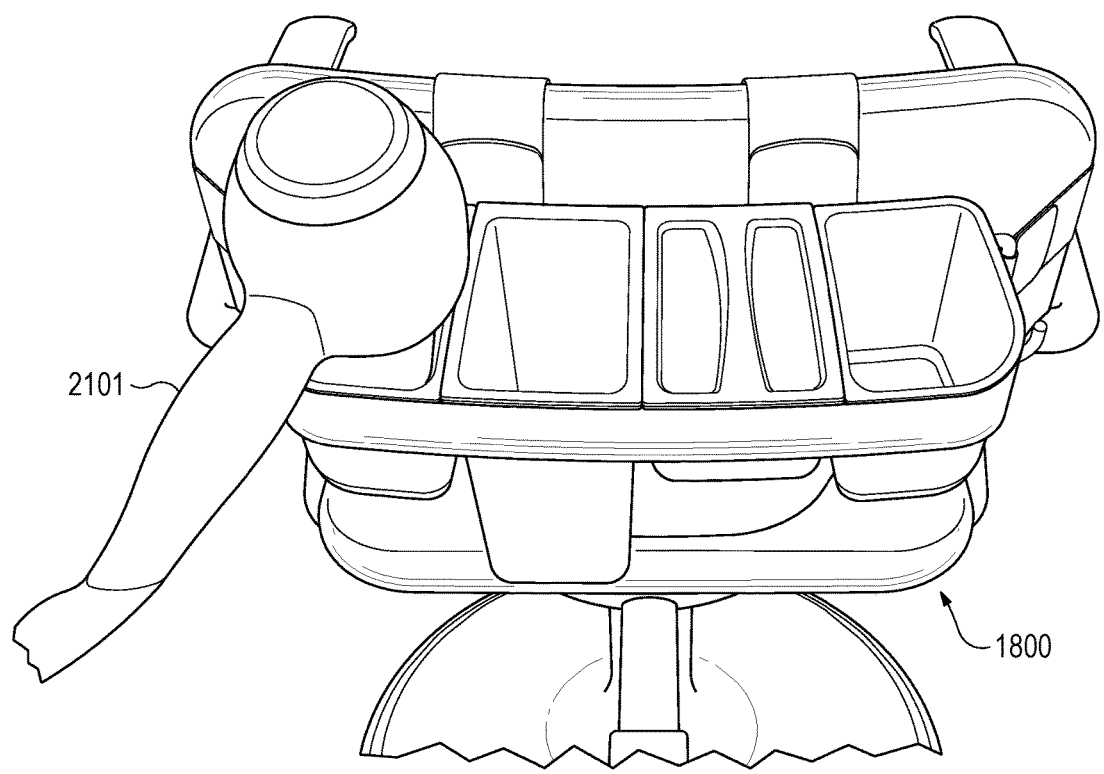
FIG. 21 Top View of Chair and Equipment Caddy with customizable accessory containers.

FIG. 21 shows a further alternative example having a single band and suspenders. Here equipment storage of a hair dryer 2101 is shown.

Figure 22:
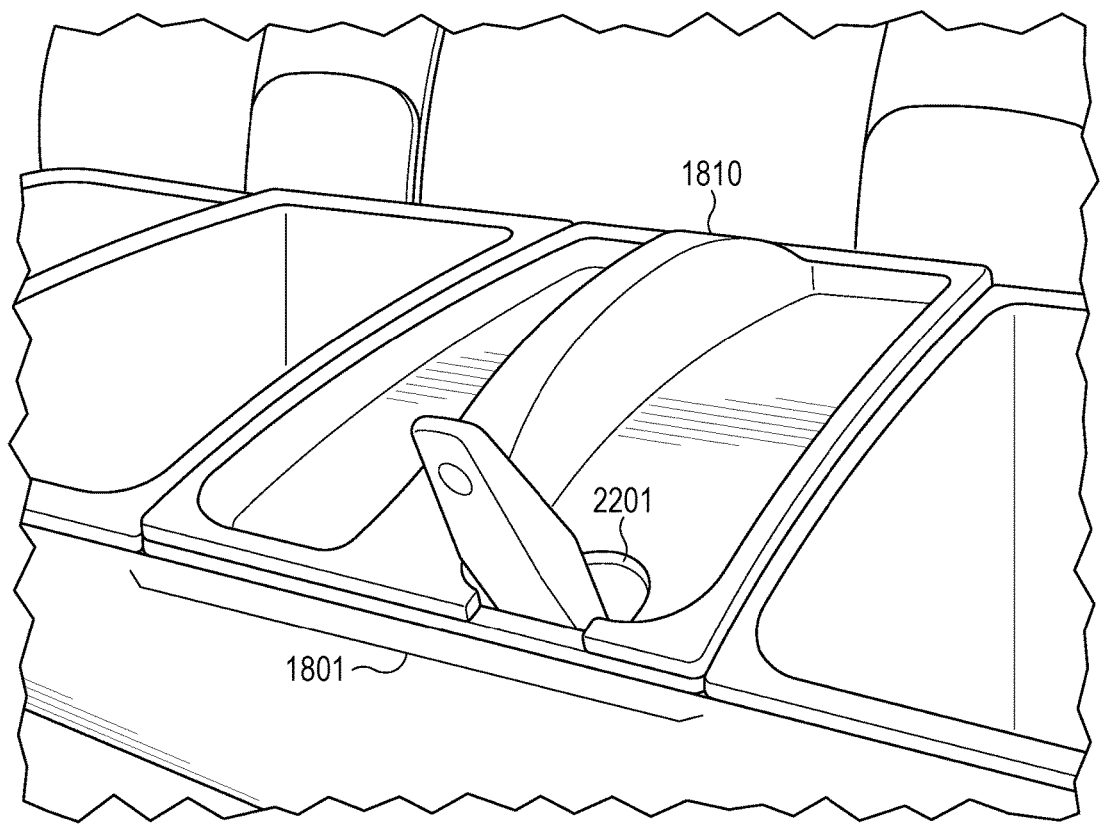
FIG. 22 Top view of hair dye container and lid.
Figure 23:
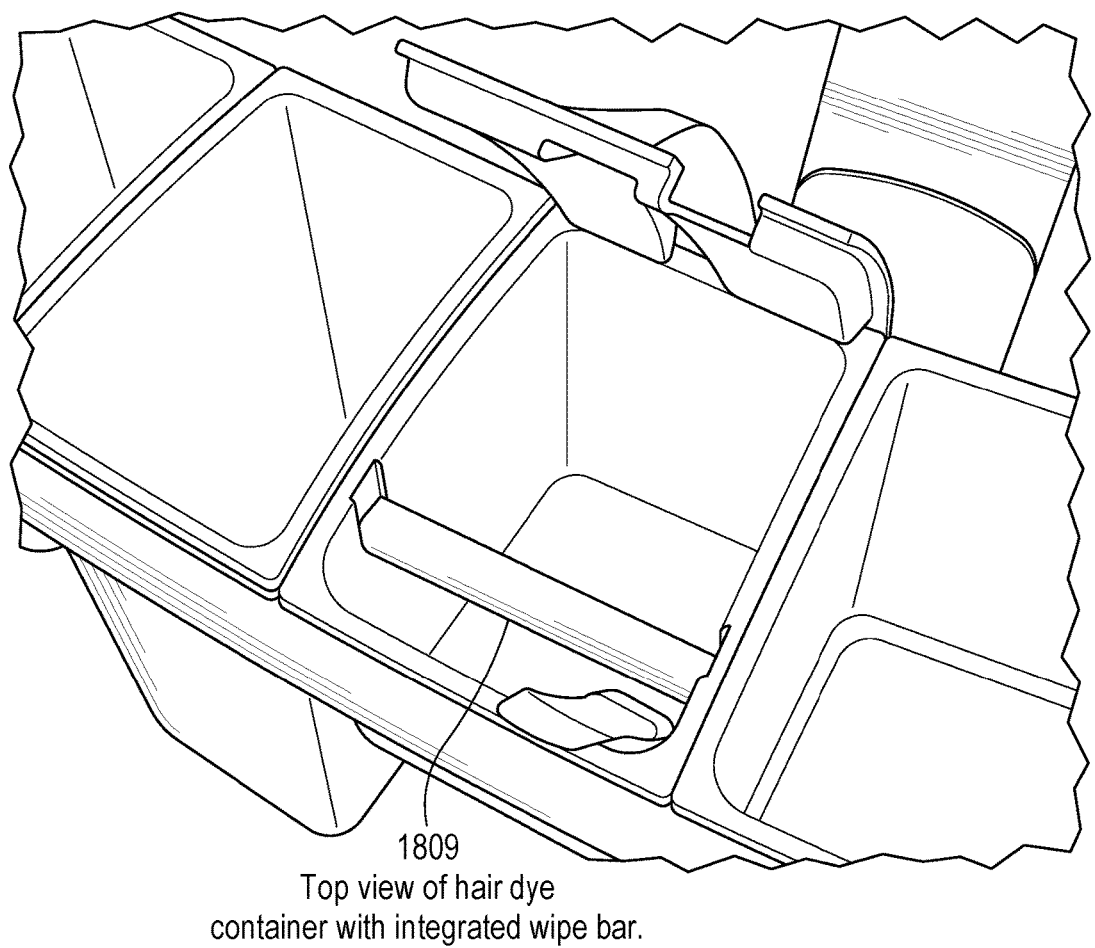
FIG. 23 Top view of hair dye container with integrated wipe bar.

FIGS. 22-23 show a unique dye container that includes a metal or equivalent wiping bar with a cover, and a let out portion to accommodate a brush handle. The container may be lined with or made from silicon material to aid in cleaning and to prevent the dye from sticking to the container.

FIG. 22 shows a top view of hair dye container 1801 and lid 1810. This configuration includes an optional aperture or nick 2201 disposed in the lid to accommodate a brush or other utensil.

FIG. 23 shows a top view of hair dye container with integrated wipe bar 1801. The wipe bar provides a way to wipe a brush without having material like hair dye foul the edge of the container.

Figure 24:
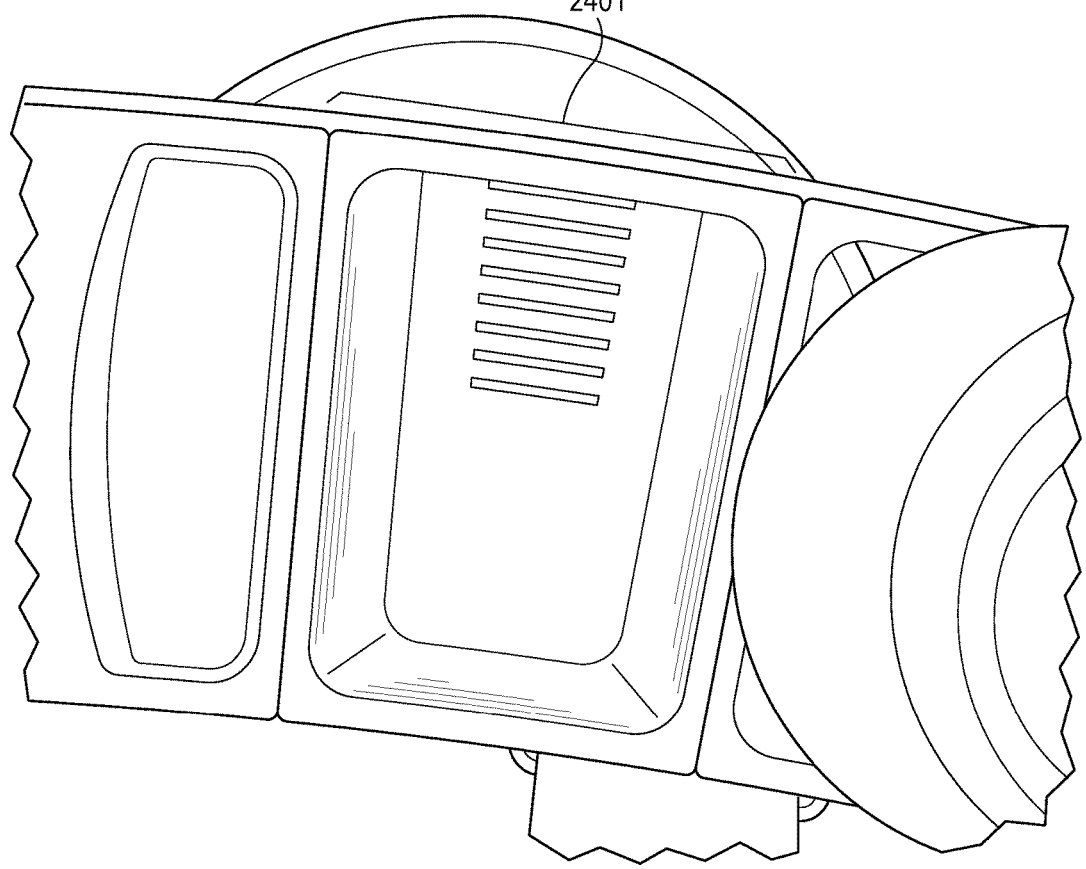
FIG. 24 Top view of curling/flat iron silicon lined and slotted container thermal protection and dissipation of heat.

FIG. 24 shows a top view of curling/flat iron silicon lined and slotted container 2401 that tends to provide thermal protection and dissipation of heat.

Figure 25:
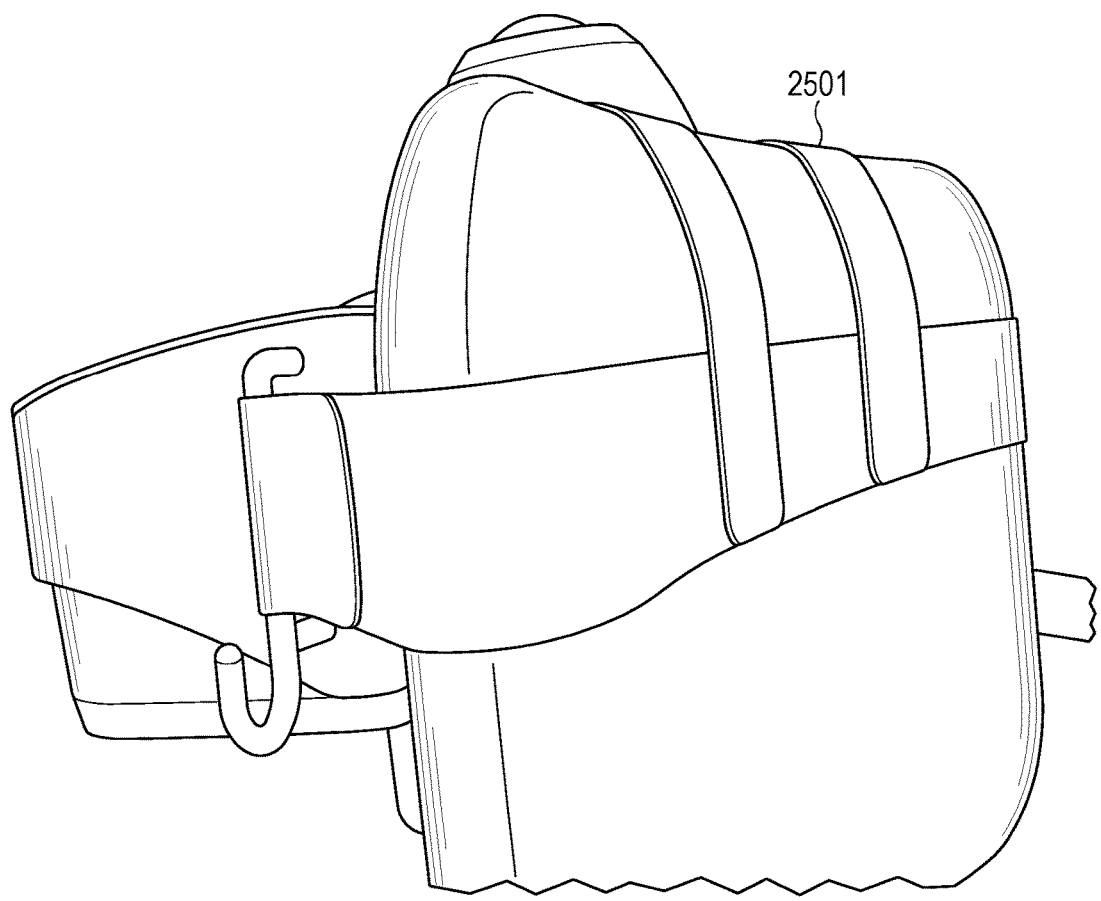
FIG. 25 Top View of Neoprene and Velcro harness attachment system.

FIG. 25 shows a top View of Neoprene and Velcro harness attachment system with suspenders 2501. The suspenders may be affixed to the horizontal band by thermal bonding or equivalent. Alternatively a removable coupling mechanism may be utilized.

Figure 26:
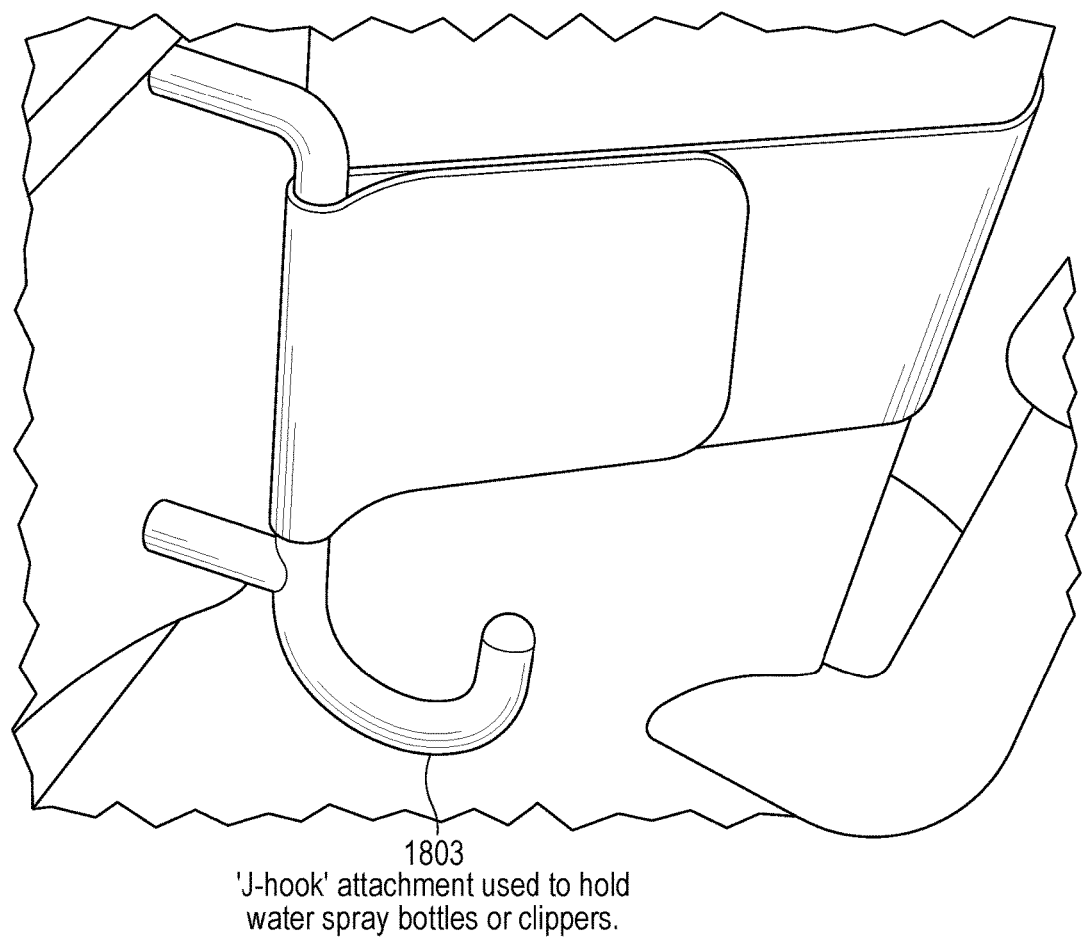
FIG. 26 Rear view of harness with 'i-hook' attachment used to hold water spray bottles or clippers.

FIG. 26 Rear view of harness with 'J-hook' 1803 attachment used to hold water spray bottles or clippers. The frame is designed with J-Hooks on either end to hold clippers or a water spray bottle. The caddy itself may be constructed to be attached to the rear of the chair with a 1" long 'J-shaped' (or equivalent) metal (or equivalent material) bracket with an opening of approximately ¼" inch allowing it to affix to the rear of the chair with four self-tapping pan head screws, or other equivalent coupling mechanism, or hardware.

1. A hair styling caddy comprising:
a endless loop housing comprising a one-piece sheet ring defining a generally elongate rectangular through opening and having opposite longitudinal ends;
a plurality of containers, each of the plurality of containers abutting another of the plurality of containers and forming a row of the containers that fills the through opening of the housing;
at least one elongated element mounted on each longitudinal end of the housing and forming respective apertures on the opposite longitudinal ends; and
an elongate material band having longitudinal ends, each longitudinal end of the material band comprising a hook material and a loop material of a mating hook and loop fastener, and each longitudinal end looped through a respective one of the apertures and adjustably attached to itself by the respective mating hook and loop fastener;
wherein the housing with the plurality of containers is supported on a rear face of a backrest of a chair by the elongate material band extending around a front face of the backrest to encircle the backrest together with the housing.

2. The hair styling caddy of claim 1, further comprising an electrical supply coupled to the housing.

3. The hair styling caddy of claim 2, wherein the electrical supply includes at least one electrical receptacle.

4. The hair styling caddy of claim 1, wherein the housing comprises molded plastic.

5. The hair styling caddy of claim 1, wherein at least one of the plurality of containers comprises a wiping edge in a form of a lip extending from an upper edge, the lip adapted for wiping a dye brush.

6. The hair styling caddy of claim 1, wherein the plurality of containers comprises containers of different depths.

7. The hair styling caddy of claim 1, wherein the elongate material band comprises an elastic material.

8. The hair styling caddy of claim 1, wherein at least one of the containers of the plurality of containers is lined with silicone.

Those skilled in the art will realize that the process sequences described above may be equivalently performed in any order to achieve a desired result. Also, sub-processes may typically be omitted as desired without taking away from the overall functionality of the processes described above.

The invention claimed is:
1. A self-contained styling chair system comprising:
a chair rotatably coupled to a base by a column so that the chair may turn freely about the column, the column further including a height control mechanism coupled to and controlled by a height control lever;
a plurality of accessories including one or more of a styling container, a styling work tray, and an articulating arm;

at least one bracket on each of the accessories, wherein the at least one bracket includes an offset portion that defines a gap between the offset portion and the accessory; and a rail system including a thin, flat, elongated rail supported on a chair back of the chair and extending lengthwise in a width direction of the chair back, the rail supported in spaced relation to the chair back by at least three spacers, the spacers spaced from each other along the width direction, the rail configured for selectively and removably supporting the plurality of accessories by hooking the offset portion of the bracket over the rail between two of the spacers.

2. The self-contained styling chair system of claim 1 in which the rail system is a horizontally parallel rail system comprising a top rectangular rail and a bottom rectangular rail, the rails including the thin, flat, elongated rail, wherein the chair back is a curved chair back, and the rails are coupled to the curved chair back via a plurality of hardware and a plurality of spacers, including the at least three spacers, and the top rectangular rail and the bottom rectangular rail are bent to conform to a curve of the chair back; and whereby each spacer of the plurality of spacers creates a gap from the rails to a back surface of the curved chair back.

3. The self-contained styling chair system of claim 2 in which the rails are aluminum.

4. The self-contained styling chair system of claim 2, further comprising a plurality of styling containers, including the styling container.

5. The self-contained styling chair system of claim 2 in which the top bracket and the bottom bracket are formed from a flat piece to have the offset formed by an offset bend so that the top bracket and the bottom bracket include a first flat surface parallel to a second flat surface.

6. The self-contained styling chair system of claim 5 in which the first flat surface of the top bracket and the bottom bracket are attached to a wall of the at least one styling container of the plurality of styling containers, and oriented so that the second flat surface of the top bracket is pointing downward, and may be hooked over the top rectangular rail and so that the second flat surface of the bottom bracket is pointing downward, and may be hooked over the bottom rectangular rail to removably couple the at least one styling container of the plurality of styling containers to the horizontally parallel rail system.

7. The self-contained styling chair system of claim 2 in which the at least one bracket further comprises:
a top bracket for coupling to the top rectangular rail; and
a bottom bracket for coupling to the bottom rectangular rail.

8. The self-contained styling chair system of claim 1, further comprising a plurality of styling containers, including the styling container, in which at least one of the styling containers is rectangularly shaped with rounded corners and is tapered from a top opening to a container bottom.

9. The self-contained styling chair system of claim 1 in which the container bottom is open.

10. The self-contained styling chair system of claim 1 in which the container bottom is perforated.

11. The self-contained styling chair system of claim 1, further comprising a plurality of styling containers, including the styling container, in which at least one of the styling containers includes a wiping bar and a lid with a let out opening to accommodate a brush disposed in the container.

12. The self-contained styling chair system of claim 1, further comprising a plurality of styling containers, including the styling container, in which at least one of the styling containers is silicon lined.

13. The self-contained styling chair system of claim 12, further comprising an integrated wipe bar in the styling container.

14. The self-contained styling chair system of claim 12, further comprising a lid disposed on the styling container.

15. The self-contained styling chair system of claim 1 in which the chair has an integrated electrical source with access for connection of a plurality of electrical styling appliances to an external electrical source, and whereby at least one of the plurality of electrical styling appliances resting in at least one of a plurality of styling utility containers, including the styling container, may be coupled to the integrated electrical source.

\* \* \* \* \*